US007816257B2

United States Patent
Cheong et al.

(10) Patent No.: US 7,816,257 B2
(45) Date of Patent: Oct. 19, 2010

(54) METHODS OF FABRICATING SEMICONDUCTOR DEVICES INCLUDING CONTACT PLUGS HAVING LATERALLY EXTENDING PORTIONS

(75) Inventors: Seong-Hwee Cheong, Seoul (KR); Gil-Heyun Choi, Gyeonggi-do (KR); Sang-Woo Lee, Seoul (KR); Jin-Ho Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 405 days.

(21) Appl. No.: 11/409,685

(22) Filed: Apr. 24, 2006

(65) Prior Publication Data

US 2006/0246710 A1     Nov. 2, 2006

(30) Foreign Application Priority Data

Apr. 27, 2005    (KR)     ....................... 10-2005-0035018

(51) Int. Cl.
*H01L 21/4763*     (2006.01)

(52) U.S. Cl. ....................... 438/639; 438/637; 438/638; 438/672; 438/675; 438/739

(58) Field of Classification Search .................. 438/629, 438/637–641, 672, 675, 701, 739
See application file for complete search history.

(56) References Cited

U.S. PATENT DOCUMENTS

| 4,857,479 A | * | 8/1989 | McLaughlin et al. | ......... | 438/348 |
|---|---|---|---|---|---|
| 4,876,212 A | * | 10/1989 | Koury | ......................... | 438/311 |
| 4,902,637 A | * | 2/1990 | Kondou et al. | ............... | 438/152 |
| 5,202,754 A | * | 4/1993 | Bertin et al. | ................. | 257/684 |
| 5,324,673 A | * | 6/1994 | Fitch et al. | ................... | 438/156 |
| 5,439,848 A | * | 8/1995 | Hsu et al. | .................... | 438/151 |
| 5,612,552 A | * | 3/1997 | Owens | ........................ | 257/202 |
| 5,874,778 A | * | 2/1999 | Bhattacharyya et al. | ..... | 257/758 |
| 5,926,700 A | | 7/1999 | Gardner et al. | | |
| 6,964,896 B2 | * | 11/2005 | Gonzalez | .................... | 438/241 |
| 7,157,305 B2 | * | 1/2007 | Prall | ........................... | 438/95 |
| 2002/0070456 A1 | * | 6/2002 | Taguwa | ...................... | 257/770 |
| 2003/0214835 A1 | * | 11/2003 | Nejad et al. | ................. | 365/158 |

FOREIGN PATENT DOCUMENTS

JP     2003-017708     1/2003

* cited by examiner

*Primary Examiner*—Ori Nadav
(74) *Attorney, Agent, or Firm*—Myers Bigel Sibley & Sajovec, P.A.

(57) ABSTRACT

In a method of forming an integrated circuit device, an opening is formed extending through a first and a second insulating layers and through a semiconductor layer therebetween to a surface of a substrate. The opening includes a recess in a sidewall thereof between the first and second insulating layers adjacent the semiconductor layer. A conductive plug is formed on the sidewall of the opening and on the surface of the substrate and laterally extending into the recess between the first and second insulating layers to contact the semiconductor layer. The semiconductor layer may be selectively etched at the sidewall without substantially etching the first and second insulating layers at the sidewall of the opening to form the recess between the first and second insulating layers. Related devices are also discussed.

12 Claims, 14 Drawing Sheets

METHODS OF FABRICATING SEMICONDUCTOR DEVICES INCLUDING CONTACT PLUGS HAVING LATERALLY EXTENDING PORTIONS

CROSS-REFERENCE TO RELATED APPLICATION

This application claims priority under 35 U.S.C. §119 from Korean Patent Application No. 2005-35018 filed on Apr. 27, 2005 in the Korean Intellectual Property Office, the disclosure of which is hereby incorporated by reference herein in its entirety.

FIELD OF THE INVENTION

The present invention relates to semiconductor devices, and more particularly, to methods of fabricating contact plugs and related devices.

BACKGROUND OF THE INVENTION

As semiconductor devices become highly integrated, sizes of patterns and intervals between the patterns may be greatly reduced. As the patterns are reduced in size, however, several problems (such as increased resistance of the patterns and/or electrical shorts between patterns) may occur. As such, a desired degree of integration may not be achieved by simply reducing the sizes of the patterns. Thus, stacked semiconductor devices have been developed. A stacked semiconductor device may include components such as metal oxide semiconductor (MOS) transistors sequentially stacked on a semiconductor substrate.

For example, a static random access memory (SRAM) device may include a relatively large cell area, as each unit cell may generally include six transistors. Hence, the transistors in the SRAM device may be vertically stacked on a substrate to reduce the unit cell area of the SRAM device.

A double-stacked SRAM device may typically include four N type MOS (NMOS) transistors formed on a substrate (i.e., two pull-down transistors and two access transistors), and two P type MOS (PMOS) transistors formed on a single crystalline silicon layer pattern positioned over the substrate (i.e., two pull-up transistors). The PMOS transistors may be electrically connected to the NMOS transistors.

A triple-stacked SRAM device may generally include two NMOS transistors formed on a substrate (i.e., two pull-down transistors), two PMOS transistors formed on a lower single crystalline silicon layer pattern positioned over the substrate (i.e., two pull-up transistors), and two NMOS transistors formed on an upper single crystalline silicon layer pattern positioned over the lower single crystalline silicon layer pattern (i.e., two access transistors).

In stacked SRAM devices, gates and/or source/drain regions of the transistors formed on the substrate and/or on the single crystalline silicon layer pattern may be electrically connected to one another. Thus, a contact plug may be provided to electrically connect the gates and/or source/drain regions of the transistors. The contact plug may have a relatively complicated electrical connection structure between the transistors, and also may have a relatively low resistance and an ohmic characteristic. As used herein, an "ohmic characteristic" means a linear relationship between current and voltage at an interface between the contact plug and the substrate and/or the single crystalline silicon layer pattern.

To form such a contact plug, a contact hole may be formed to expose the gates and the source/drain regions, and a barrier metal layer may be formed on a bottom surface and a sidewall of the contact hole. Then, a metal layer may be formed on the barrier metal layer to fill the contact hole. The barrier metal layer may serve as an ohmic contact layer between the metal layer and the gates and/or the source/drain regions.

However, as the contact plug is reduced in size and/or increased in height, the barrier metal layer may not be uniformly formed on the bottom surface and/or the sidewall of the contact hole. Therefore, ohmic contact may not be properly provided at portions of the contact hole where the barrier metal layer is relatively thin and/or where the barrier metal layer is not formed.

In a conventional stacked semiconductor device, source/drain regions of transistors formed in a single crystalline silicon layer pattern may make contact with side portions of a contact plug, so that the source/drain regions are electrically connected to the contact plug. However, when a barrier metal layer has poor step coverage, the barrier metal layer may not be uniformly formed between the source/drain regions and the contact plug. Thus, ohmic contact also may not be provided between the contact plug and the source/drain regions, which may thereby cause electrical failure of the stacked semiconductor device.

SUMMARY OF THE INVENTION

Some embodiments of the present invention may provide a contact plug having a relatively low resistance and an ohmic characteristic at an interface between the contact plug and a substrate and/or a single crystalline silicon layer pattern and a method of fabricating the same.

According to some embodiments of the present invention, in a method of forming an integrated circuit device, a first insulating layer may be formed on a substrate. A semiconductor layer may be formed on the first insulating layer, and a second insulating layer may be formed on the semiconductor layer. An opening may be formed extending through the first and second insulating layers and through the semiconductor layer therebetween to a surface of the substrate. The opening may include a recess in a sidewall thereof between the first and second insulating layers adjacent the semiconductor layer. A conductive plug may be formed on the sidewall of the opening and on the surface of the substrate and laterally extending into the recess between the first and second insulating layers to contact the semiconductor layer.

In some embodiments, the semiconductor layer may be selectively recessed at the sidewall of the opening to form the recess between the first and second insulating layers. For example, the semiconductor layer may be etched at the sidewall of the opening without substantially etching the first and second insulating layers at the sidewall.

In other embodiments, in forming the conductive plug, a conductive layer may be formed on the sidewall of the opening and on the surface of the substrate and laterally extending into the recess between the first and second insulating layers to contact the recessed semiconductor layer. The conductive layer may be formed to a greater thickness in the recess between the first and second insulating layers than on the sidewall. For example, portions of the conductive layer on the sidewall may have a thickness in a range of about 5 Angstroms (Å) to about 100 Angstroms (Å).

In some embodiments, a buffer layer may be formed on the first conductive layer on the sidewall of the opening and on the surface of the substrate. In addition, a second conductive layer may be formed on the buffer layer and the first conductive layer to substantially fill the opening. The first and second conductive layers may be a first and a second metal layers, respectively, and the buffer layer may be a metal nitride layer.

In other embodiments, in forming the second conductive layer, a lower metal layer may be formed on the metal nitride layer on the sidewall of the opening and on the surface of the substrate using an atomic layer deposition (ALD) process. Then, an upper metal layer may be formed on the lower metal layer using a chemical vapor deposition (CVD) process to substantially fill the opening.

In some embodiments, prior to forming the opening, a first transistor (including a first source/drain region in the substrate) may be formed on the substrate. A second transistor (including a second source/drain region in the semiconductor layer) may be formed on the semiconductor layer. In forming the conductive plug, a conductive layer may be formed on the sidewall of the opening and the surface of the substrate and laterally extending into the recess between the first and second insulating layers to electrically contact the first source/drain region and the second source/drain region.

In other embodiments, prior to forming the opening, a second semiconductor layer may be formed on the second insulating layer, and a third transistor (including a third source/drain region in the second semiconductor layer) may be formed on the second semiconductor layer. Also, a third insulating layer may be formed on the second semiconductor layer. In forming the opening, the first and second semiconductor layers may be selectively recessed at the sidewall of the opening to respectively form first and second recesses therein. The conductive layer may be formed to laterally extend into the first recess between the first and second insulating layers to electrically contact the second source/drain region, and to laterally extend into the second recess between the second and third insulating layers to electrically contact the third source/drain region.

In some embodiments, in forming the conductive plug, a conductive layer may be formed on the sidewall of the opening and on the substrate surface and laterally extending into the recess between the first and second insulating layers using an atomic layer deposition (ALD) process. The conductive layer may be formed at a temperature of about 50 degrees Celsius to about 450 degrees Celsius.

In other embodiments, in forming the conductive layer, a first reaction gas may be introduced into a chamber including the substrate. A portion of the first reaction gas may be chemically absorbed onto the sidewall, the recess, and the surface of the substrate. Then, a second reaction gas may be introduced into the chamber to form a metal layer on the sidewall, the substrate of the substrate, and in the recess. The first reaction gas may be $SiH_4$ and/or $B_2H_6$, and the second reaction gas may be $WF_6$.

According to further embodiments of the present invention, an integrated circuit device may include a substrate, a first insulating layer on the substrate, a semiconductor layer on the first insulating layer, and a second insulating layer on the semiconductor layer. An opening may extend through the first and second insulating layers and the semiconductor layer to a surface of the substrate. The opening may include a recess in a sidewall thereof between the first and second insulating layers adjacent the semiconductor layer. A contact plug may include a conductive layer on the sidewall of the opening and on the surface of the substrate. The conductive layer may laterally extend into the recess between the first and second insulating layers to contact the semiconductor layer.

In some embodiments, a thickness of a portion of the conductive layer extending into the recess may be greater than a thickness of portions of the conductive layer on the sidewall. For example, the portions of the conductive layer on the sidewall may have a thickness in a range of about 5 Angstroms (Å) to about 100 Angstroms (Å).

In other embodiments, the device may include a second conductive layer on the first conductive layer and substantially filling the opening. In addition, a buffer layer may be on the sidewall of the opening and on the surface of the substrate between the first and second conductive layers. The first and second conductive layers may be a first and a second metal layers, respectively, and the buffer layer may be a metal nitride layer. For example, the first conductive layer may be tungsten, and the buffer layer may be tungsten nitride. In addition, the semiconductor layer may be single crystalline silicon.

In some embodiments, the device may further include a first transistor on the substrate, and a second transistor on the semiconductor layer. The first transistor may include a first source/drain region in the substrate surface, and the second transistor may include a second source/drain region in the semiconductor layer. The conductive layer may extend on the sidewall of the opening and the surface of the substrate, and may laterally extend into the recess between the first and second insulating layers to electrically contact the first source/drain region and the second source/drain region.

In other embodiments, the device may include a second semiconductor layer on the second insulating layer, a third transistor on the second semiconductor layer, and a third insulating layer on the second semiconductor layer. The third transistor may include a third source/drain region in the second semiconductor layer. The opening may include a first and a second recesses in the sidewall respectively adjacent the first and second semiconductor layers. The conductive layer may laterally extend into the first recess between the first and second insulating layers to electrically contact the second source/drain region, and may laterally extend into the second recess between the second and third insulating layers to electrically contact the third source/drain region.

According to still other embodiments of the present invention, a contact plug in an integrated circuit device including a contact hole extending through a first insulating layer, a semiconductor layer, and a second insulating layer may include a conductive layer on a sidewall of the contact hole defined by first and second insulating layers and the semiconductor layer therebetween. The conductive layer may laterally extend into a recess in the sidewall between the first and second insulating layers and adjacent the semiconductor layer to electrically contact the semiconductor layer.

According to some other embodiments of the present invention, a stacked semiconductor device may include an insulating interlayer structure, at least one single crystalline silicon layer pattern, a first metal layer pattern, a metal nitride layer pattern, and a second metal layer pattern. The insulating interlayer structure may be formed on a substrate including single crystalline silicon. The insulating interlayer structure may include insulating interlayer patterns and a contact hole structure formed through the insulating interlayer patterns to expose a portion of the substrate. The single crystalline silicon layer pattern may be formed between the insulating interlayer patterns. A portion of the single crystalline silicon layer pattern may be exposed by a recess in the contact hole structure. The first metal layer pattern may be formed on a sidewall of the contact hole structure and the exposed portion of the substrate to horizontally fill the recess. The metal nitride layer pattern may be formed on the first metal layer pattern. The second metal layer pattern may be formed on the metal nitride layer pattern to fill the contact hole structure.

In some embodiments of the present invention, the first metal layer pattern and the metal nitride layer pattern may be formed by an atomic layer deposition (ALD) process.

In other embodiments of the present invention, the first metal layer pattern may have a thickness of about 5 Å to about 100 Å. The metal nitride layer pattern may also have a thickness of about 5 Å to about 100 Å.

In some embodiments of the present invention, the first metal layer pattern may include tungsten, and the metal nitride layer pattern may include tungsten nitride.

In other embodiments of the present invention, the second metal layer pattern may include tungsten.

In some embodiments of the present invention, a transistor may be formed on the single crystalline silicon layer pattern. The transistor may include source/drain regions formed at portions of the single crystalline silicon layer pattern making contact with the first metal layer pattern.

According to other embodiments of the present invention, a method of manufacturing a stacked semiconductor device may include forming insulating interlayers on a substrate including single crystalline silicon. A preliminary single crystalline silicon layer pattern serving an active region may be formed between the insulating interlayers. An insulating interlayer structure may be formed on the substrate by partially etching the insulating interlayers. The insulating interlayer structure may have a contact hole structure that exposes a portion of the preliminary single crystalline silicon layer pattern and a portion of the substrate. A single crystalline silicon layer pattern and a recess in the contact hole structure may be formed by partially and/or selectively etching the preliminary single crystalline silicon layer pattern. A first metal layer pattern may be formed in the recess, on a sidewall of the contact hole structure, and on the exposed portion of the substrate. The first metal layer pattern may extend laterally to horizontally fill the recess. A metal nitride layer pattern may be formed on the first metal layer pattern. A second metal layer pattern may be formed on the metal nitride layer pattern to fill the contact hole structure.

In some embodiments of the present invention, the first metal pattern and the metal nitride layer pattern may be formed in-situ using one chamber.

In other embodiments of the present invention, the first metal layer pattern, the metal nitride layer pattern and the second metal layer pattern may be formed at a temperature of about 50° C. to about 450° C.

In some embodiments of the present invention, the second metal layer pattern may be formed by forming a lower metal layer on the metal nitride layer pattern and the insulating interlayer structure by an ALD process to partially fill the contact hole structure, by forming an upper metal layer on the lower metal layer by a chemical vapor deposition (CVD) process to substantially fill the contact hole structure, and by removing portions of the upper metal layer and the lower metal layer until a surface of the insulating interlayer structure is exposed.

In other embodiments of the present invention, the single crystalline silicon layer pattern may be formed by a wet etching process using an etching solution that has an etching selectivity ratio of greater than about 1:10 between the preliminary single crystalline silicon layer pattern and the insulating interlayer structure. The etching solution may include $NH_4OH$, $H_2O_2$ and $H_2O$, for example, at a ratio of about 4:1:95.

In some embodiments of the present invention, the first metal layer pattern may be formed by chemisorbing a first reaction gas for nucleation onto the recess, the sidewall of the contact hole structure and the exposed portion of the substrate, by purging a physisorbed first reaction gas, by forming a tungsten film in the recess, on the sidewall of the contact hole structure and on the exposed portion of the substrate by reacting the chemisorbed first reaction gas and a second reaction gas, by purging an unreacted second reaction gas, and by repeating the steps of chemisorbing the first reaction gas, purging the physisorbed first reaction gas, forming the tungsten film and purging the unreacted second reaction gas. The first reaction gas may include $SiH_4$ or $B_2H_6$, and the second reaction gas may include $WF_6$. The first metal layer pattern may be formed at a pressure in the range of about 1 mTorr to about 760 mTorr.

In other embodiments of the present invention, the metal nitride layer pattern may be formed by chemisorbing a first reaction gas for nucleation onto the first metal layer pattern, by purging a physisorbed first reaction gas, by chemisorbing a second reaction gas onto the chemisorbed first reaction gas, by purging a physisorbed second reaction gas, by forming a tungsten nitride film on the first metal layer pattern by reacting a third reaction gas with the chemisorbed first reaction gas and the second reaction gas, by purging an unreacted third reaction gas, and by repeating the steps of chemisorbing the first reaction gas, purging the physisorbed first reaction gas, chemisorbing the second reaction gas, purging the physisorbed second reaction gas, forming the tungsten nitride film, and purging the unreacted third reaction gas. The first reaction gas may include $SiH_4$ or $B_2H_6$, the second reaction gas may include $WF_6$, and the third reaction gas may include $NH_3$. The metal nitride layer pattern may be formed at a pressure in the range of about 1 mTorr to about 760 mTorr.

In some embodiments of the present invention, a transistor having a gate structure and source/drain regions may be formed on the single crystalline silicon layer pattern.

Thus, according to some embodiments of the present invention, a stacked semiconductor device may include a contact plug that has a relatively low resistance and ohmic characteristics at an interface between the contact plug and a substrate and at an interface between the contact plug and a single crystalline silicon layer pattern. As such, the stacked semiconductor device may have improved reliability and/or reduced probability of electrical failure. Additionally, a throughput of a process for manufacturing the stacked semiconductor device may be enhanced.

DETAILED DESCRIPTION OF EMBODIMENTS OF THE INVENTION

Figure 1:
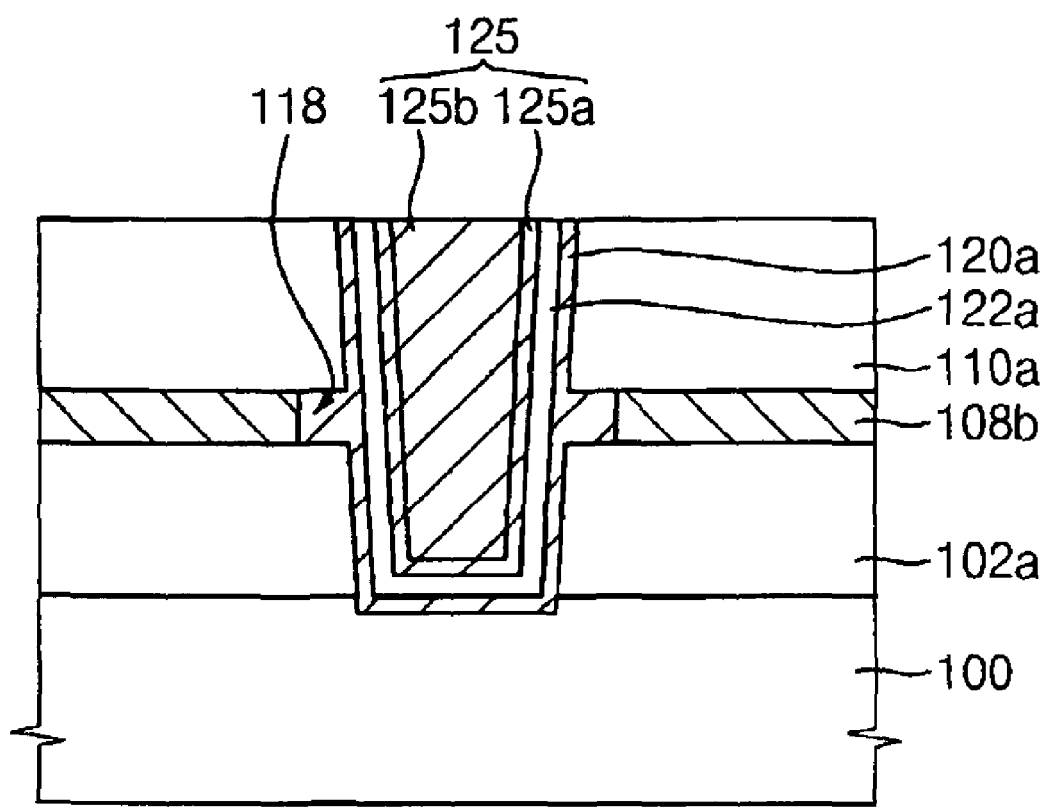
FIG. 1 is a cross-sectional view illustrating a stacked semiconductor device including a laterally extending contact plug making contact with a single crystalline silicon layer pattern in accordance with some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like reference numerals refer to the same or similar elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1 is a cross-sectional view illustrating a stacked semiconductor device including a laterally extending contact plug that makes contact with a side portion of a single crystalline silicon layer pattern in accordance with some embodiments of the present invention. Referring now to FIG. 1, an insulating interlayer structure is formed on a substrate 100. The substrate 100 may include a single crystalline silicon wafer or a silicon-on-insulator (SOI) substrate. The insulating interlayer structure includes a plurality of insulating interlayer patterns. A contact hole structure is formed extending through the insulating interlayer patterns. The contact hole structure partially exposes a surface of the substrate 100.

In some embodiments of the present invention, the insulation interlayer structure includes a first insulating interlayer pattern 102a and a second insulating interlayer pattern 110a. The contact hole structure has a first contact opening/hole and a second contact hole. The first contact hole is formed extending through the first insulating interlayer pattern 102a, and the second contact hole is formed extending through the second insulating interlayer pattern 110a. The second contact hole is connected to the first contact hole. More particularly, the first insulating interlayer pattern 102a having the first contact hole is formed on the substrate 100. The first contact hole partially exposes a surface of the substrate 100. The first insulating interlayer pattern 102a may include an oxide, such as silicon oxide. For example, the first insulating interlayer pattern 102a may include a high-density plasma chemical vapor deposition (HDP-CVD) oxide, boro-phosphor silicate glass (BPSG), etc. The second insulating interlayer pattern 110a is formed over the first insulating interlayer pattern 102a. The second insulating interlayer pattern 110a includes the second contact hole exposing the first contact hole. The second insulating interlayer pattern 110a may also include an oxide, such as silicon oxide.

A single crystalline silicon layer pattern 108b is formed between the first insulating interlayer pattern 102a and the second insulating interlayer pattern 110a. The single crystalline silicon layer pattern 108b may serve as an additional active region of the stacked semiconductor device. A portion of the single crystalline silicon layer pattern 108b is exposed through a recess 118 making contact with the sidewall of the contact hole structure having the first and the second contact holes. More particularly, a side portion of the single crystalline silicon layer pattern 108b is exposed by the recess 118. Unit elements such as transistors may be formed on the single crystalline silicon layer pattern 108b.

A first metal layer pattern 120a is formed on the sidewall of the contact hole structure and laterally extends into the recess 118 to fill the recess 118. Thus, the first metal layer pattern 120a contacts the single crystalline silicon layer pattern 108b. The first metal layer pattern 120a is also formed on an exposed surface of the substrate 100 (i.e., on a lower/bottom face of the contact hole structure).

The first metal layer pattern 120a may be formed using a metal that is easily formed to fill the recess 118 and has good step coverage. Additionally, the metal in the first metal layer pattern 120a may have a relatively low specific resistance. The first metal layer pattern 120a may be formed by an atomic layer deposition (ALD) process, to provide good step coverage. In the ALD process, the first metal layer pattern 120a may be formed at a relatively low temperature in the range of about 50° C. to about 450° C. Thus, the single crystalline silicon layer pattern 108b may not be significantly consumed by a reaction between the first metal layer pattern 120a and the single crystalline silicon layer pattern 108b. For example, the first metal layer pattern 120a may be formed using tungsten (W).

The first metal layer pattern 120a laterally extends into the recess 118 to directly contact the exposed portion of the single crystalline silicon layer pattern 108b. Further, the first metal layer pattern 120a contacts the exposed surface of the substrate 100. Accordingly, the single crystalline silicon layer pattern 108b is electrically connected to the substrate 100 by the first metal layer pattern 120a. The first metal layer pattern 120a may serve as an ohmic contact layer between the substrate 100 and the single crystalline silicon layer pattern 108b. If the first metal layer pattern 120a has a thickness of below about 5 Angstroms (Å), the first metal layer pattern 120a may not sufficiently serve as the ohmic layer. Similarly, the first metal layer pattern 120a may not properly adhere to the substrate 100 and/or the single crystalline silicon layer pattern 108b (and also, the processing time for forming the first metal layer 120a may increase) if the first metal layer pattern 120a has a thickness of above about 100 Å. Therefore, the first metal layer pattern 120a may be formed to a thickness in the range of about 5 Å to about 100 Å. For example, the thickness of the first metal layer pattern 120a may be about 25 Å to about 35 Å.

Since the first metal layer pattern 120a laterally extends into the recess 118, a portion of the first metal layer pattern 120a therein may be relatively thicker than other portions of the first metal layer pattern 120a.

A metal nitride layer pattern 122a serving as a buffer layer is formed on the first metal layer pattern 120a. The metal nitride layer pattern 122a may be formed, for example, of tungsten nitride. The metal nitride layer pattern 122a may be formed by an ALD process to provide good step coverage. If the metal nitride layer pattern 122a has a thickness of below about 5 Å, the metal nitride layer pattern 122a may not be properly attached to the first metal layer pattern 120a. Likewise, a resistance of the contact plug including the metal nitride layer pattern 122a may increase if the metal nitride layer pattern 122a has a thickness of above about 100 Å. Thus, the metal nitride layer pattern 122a may be formed to a thickness in the range of about 5 Å to about 100 Å. For example, the thickness of the metal nitride layer pattern 122a may be about 25 Å to about 35 Å.

A second metal layer pattern 125 is formed on the metal nitride layer pattern 122a to substantially fill the contact hole structure. The second metal layer pattern 125 may include a lower metal layer pattern 125a and an upper metal layer pattern 125b. The lower metal layer pattern 125a is formed on the metal nitride layer pattern 122a to partially fill the contact hole structure, and the upper metal layer pattern 125b is formed on the lower metal layer pattern 125a to substantially fill the contact hole structure. The lower metal layer patterns 125a may be formed by an ALD process, whereas the upper metal layer pattern 125b may be formed through a CVD process. The second metal layer patterns 125 may be formed using a metal, such as tungsten, to provide good step coverage.

If the lower metal layer pattern 125a has a thickness of below about 5 Å, the upper metal layer pattern 125b may not be properly formed without generating a void and/or a seam therein. Also, if the lower metal layer pattern 125a has a thickness of above about 100 Å, a processing time for forming the lower metal layer pattern 125a may increase. Therefore, the lower metal layer pattern 125a may be formed to a thickness in the range of about 5 Å to about 100 Å. For example, the lower metal layer pattern 125a may have a thickness in the range of about 25 Å to about 35 Å.

As described above, the first metal layer pattern 120a fills the recess 118 between the single crystalline silicon layer pattern 108b and the contact structure, so that a resistance between the single crystalline silicon layer pattern 108b and the contact structure may be greatly reduced. Additionally, the first metal layer pattern 120a may serve as an ohmic layer between the single crystalline silicon layer pattern 108b and the substrate 100.

Figure 2:
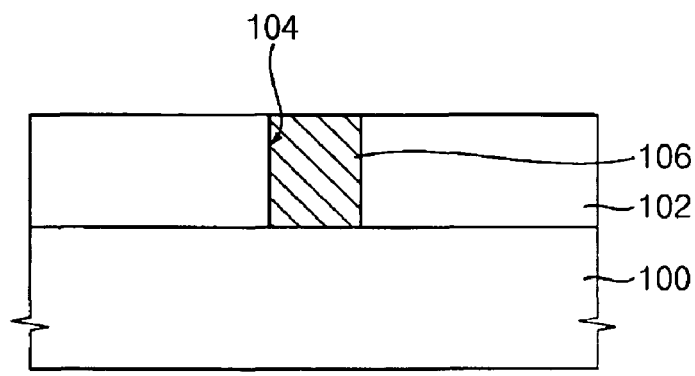
FIGS. 2 to 9 are cross-sectional views illustrating methods of fabricating stacked semiconductor devices in accordance with some embodiments of the present invention.

FIGS. 2 to 9 are cross-sectional views illustrating methods of fabricating a stacked semiconductor device in accordance with some embodiments of the present invention. Referring now to FIG. 2, a first insulating interlayer 102 is formed on a substrate 100 including single crystalline silicon. The first insulating interlayer 102 may be formed of an oxide, such as silicon oxide, using a CVD process. For example, the first insulating interlayer 102 may include a HDP-CVD oxide or BPSG. Unit devices such as transistors may be formed on the substrate 100.

The first insulating interlayer 102 is partially etched to form an opening 104 that exposes a surface of the substrate 100. In some embodiments of the present invention, a cleaning process may be performed on the substrate 100 in order to remove any native oxide film formed on the substrate 100. The cleaning process may be performed using a cleaning solution including hydrogen fluoride (HF).

An epitaxial layer (not shown) is formed on the first insulating interlayer 102 by a selective epitaxial growth (SEG) process to fill the opening 104. The epitaxial layer may be formed using the exposed portion of the substrate 100 as a seed layer. If the epitaxial layer is formed at a temperature of below about 750° C., the epitaxial layer may not be properly grown from the exposed portion of the substrate 100. Also, if the epitaxial layer is formed at a temperature of above about 1,250° C., the epitaxial layer may be excessively formed on the first insulating interlayer 102 from the seed layer. Thus, the epitaxial layer may be formed at a temperature in the range of about 750° C. to about 1,250° C. For example, the epitaxial layer may be formed at a temperature in the range of about 800° C. to about 900° C.

The epitaxial layer may be formed using a reaction gas that includes a silicon source gas. Examples of such a silicon source gas may include silicon tetrachloride ($SiCl_4$), silane ($SiH_4$), dichlorosilane ($SiH_2Cl_2$), and/or trichlorosilane ($SiHCl_3$). These gases can be used alone or in a mixture thereof.

The epitaxial layer is partially removed until the first insulating interlayer 102 is exposed to thereby form an epitaxial layer pattern 106 filling the opening 104. The epitaxial layer pattern 106 may be formed by a chemical mechanical polishing (CMP) process and/or an etch back process.

Figure 3:
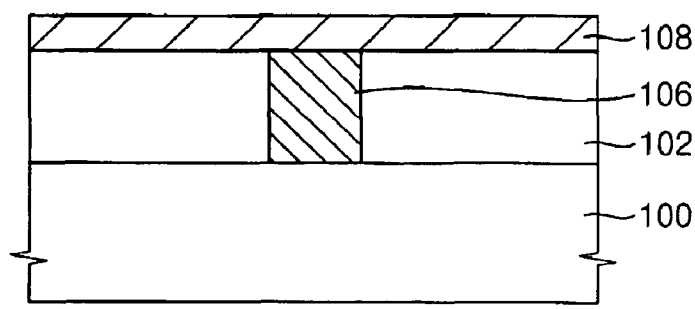

Referring to FIG. 3, an amorphous silicon layer (not shown) is formed on the first insulating interlayer 102 and the epitaxial layer pattern 106. The amorphous silicon layer may be formed, for example, by a CVD process.

The amorphous silicon layer is converted into a single crystalline silicon layer 108 through a phase change treatment process. The phase change treatment process may include a thermal process. In other words, a phase of the amorphous silicon layer may be changed by thermally treating the amorphous silicon layer to convert the amorphous silicon layer into the single crystalline silicon layer 108. During formation of the single crystalline silicon layer 108, the epitaxial layer pattern 106 may serve as a seed layer for changing the crystalline structure of the amorphous silicon layer.

Figure 4:
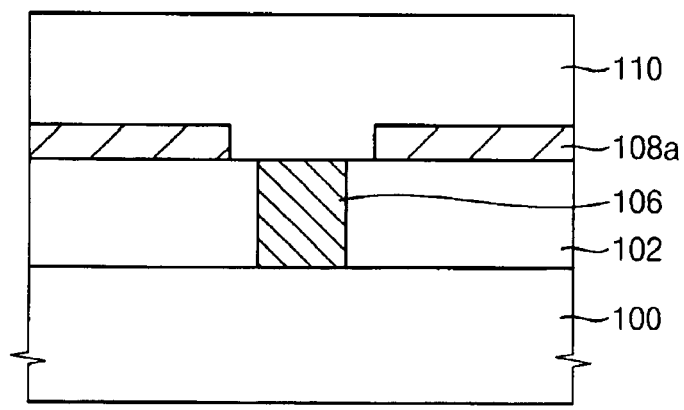

Referring to FIG. 4, the single crystalline silicon layer 108 is selectively etched to provide an opening extending therethough, to form a preliminary single crystalline silicon layer pattern 108a on the first insulating interlayer 102. The preliminary single crystalline silicon layer pattern 108a will be further patterned to form a single crystalline silicon layer pattern 108b (see FIG. 6) that may serve as an additional active region of the stacked semiconductor device. When the preliminary single crystalline silicon layer pattern 108a is formed on the first insulating interlayer 102, a portion of the first insulating interlayer 102 and an upper face of the epitaxial layer pattern 106 are exposed. Additional unit devices, for example, transistors may be formed on the preliminary single crystalline silicon layer pattern 108a.

A second insulating interlayer 110 is formed on the preliminary single crystalline silicon layer pattern 108a, the exposed portion of the first insulating interlayer 102 and the epitaxial layer pattern 106. The second insulating interlayer 110 may be formed of an oxide, such as silicon oxide.

Figure 5:
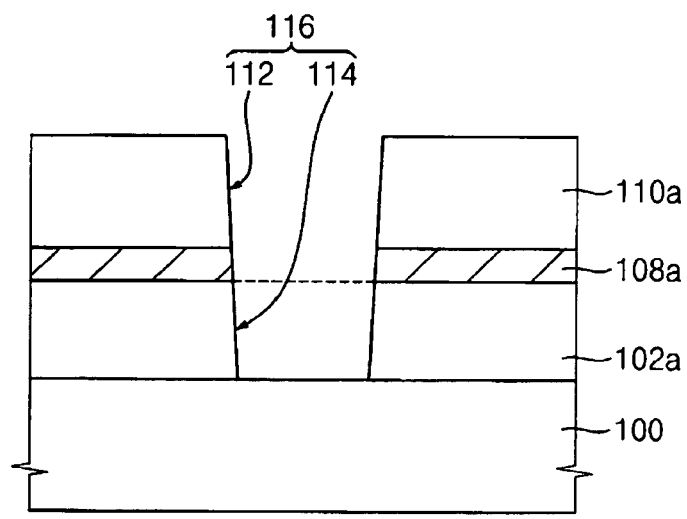

Referring to FIG. 5, a first contact hole 114 and a second contact hole 112 are formed by partially etching the first insulating interlayer 102 and the second insulating interlayer 110. In particular, the second contact hole 112 is formed extending through the second insulating interlayer 110 by etching a portion of the second insulating interlayer 110 under which the epitaxial layer pattern 106 is positioned. Then, the first contact hole is formed extending through the first insulating layer 102 by etching a portion of the first insulating interlayer 102 including the epitaxial layer pattern 106. Therefore, a contact structure/opening 116 including the first contact hole 114 and the second contact hole 112 is formed extending through the first insulating interlayer 102, the preliminary single crystalline silicon layer pattern 108a, and the second insulating interlayer 110.

When the contact hole structure 116 is formed, the first insulating interlayer 102 and the second insulating interlayer 110 form a first insulating interlayer pattern 102a and a second insulating interlayer pattern 110a. Hence, an insulation interlayer structure including the first insulating interlayer pattern 102a and the second insulating interlayer pattern 110a is formed on the substrate 100, including the single crystalline silicon layer pattern 108a between the first insulating interlayer pattern 102a and the second insulating interlayer pattern 110a.

A side portion of the preliminary single crystalline silicon layer pattern 108a is exposed through the contact hole structure 116. In the etching process used to form the first contact hole 114, the epitaxial layer pattern 106 is removed together with the portion of the first insulating interlayer 102.

Figure 6:
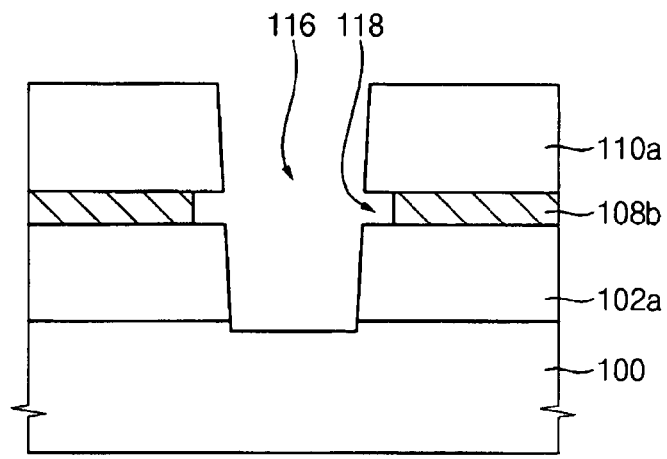

Referring to FIG. 6, a portion of the preliminary single crystalline layer pattern 108a exposed by the contact hole structure 116 is removed to thereby form a recess 118 from the sidewall of the contact structure 116. The recess 118 extends horizontally relative to the substrate 100 between the first and second insulating patterns 102a and 110a. When the recess 118 is formed, the preliminary single crystalline layer pattern 108a forms a single crystalline layer pattern 108b.

In the etching process for forming the recess 118, a width of the contact hole structure 116 may be augmented, as the first and the second insulating interlayer patterns 102a and 110a may be partially etched. However, if the width of the contact hole structure 116 is increased, an electrical failure (such as an electrical short) may occur. Thus, a portion of the preliminary single crystalline layer pattern 108a may be selectively recessed without substantially etching the first and/or the second insulating interlayer patterns 102a and 110a during the etching process for forming the recess 118. In some embodiments of the present invention, the recess 118 may be formed via a wet etching process, using an etching solution that has an etching selectivity ratio of about 1:10 between the insulating structure and the preliminary single crystalline layer pattern 108a. For example, the recess 118 may be formed using an etching solution including $NH_4OH$, $H_2O_2$ and $H_2O$ at a ratio of about 4:1:95.

Figure 7:
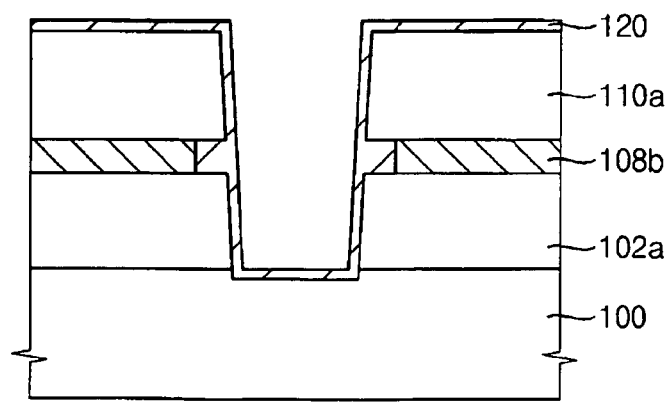

Referring to FIG. 7, a first metal layer 120 is formed on the sidewall and the lower surface of the contact hole structure 116 to fill the recess 118. The first metal layer 120 may laterally extend to fill the recess 118 without generation of a void or a seam, because the first metal layer 120 may be formed of a metal having good step coverage. For example, the first metal layer 120 may be formed of tungsten. Since the contact hole structure 116 exposes a surface of the substrate 100, the first metal layer 120 is formed on the exposed portion of the substrate 100 (i.e., the lower/bottom face of the contact hole structure 116).

The first metal layer 120 is formed on the contact hole structure 116 having a relatively high aspect ratio, and the first metal layer 120 may be formed by an ALD process to provide good step coverage. Additionally, since the first metal layer 120 may be formed at a relatively low temperature in the range of about 50° C. to about 450° C. using the ALD process, a reaction between the first metal layer 120 and the single crystalline silicon layer pattern 108b may be reduced and/or prevented. Thus, the single crystalline silicon layer pattern 108b may not be significantly consumed in the process for forming the first metal layer 120.

The first metal layer 120 may have a thickness in the range of about 5 Å to about 100 Å measured from the sidewall of the contact hole structure 116. For example, the thickness of the first metal layer 120 may be about 25 Å to about 35 Å. Since the first metal layer 120 laterally extends into the recess 118, a portion of the first metal layer 120 in the recess 118 may have a greater thickness than other portions of the first metal layer 120. When the portion of the first metal layer 120 in the recess 118 has such a thickness, a sheet resistance between the single crystalline silicon layer pattern 108b and the portion of the first metal layer 120 may decrease.

Hereinafter, a process for forming the first metal layer 120 by the ALD process will be described in detail.

Figure 10:
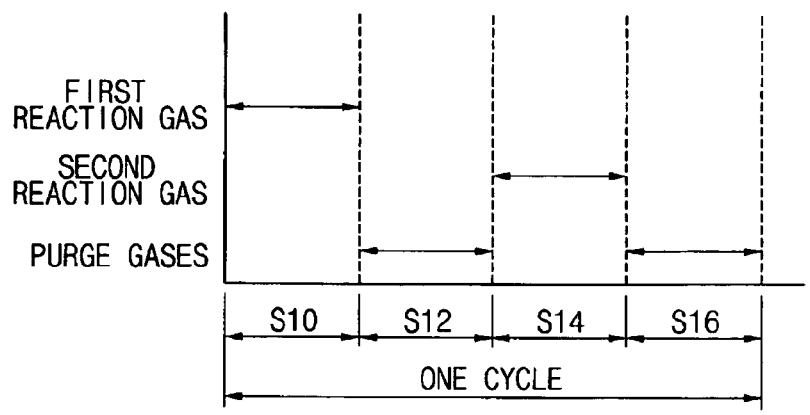
FIG. 10 is a timing diagram illustrating reaction gases which may be used in a process for forming a first metal layer in accordance with some embodiments of the present invention.

FIG. 10 is a timing diagram illustrating reaction gases used in a process for forming the first metal layer 120 in accordance with some embodiments of the present invention. In the ALD process for forming the first metal layer 120, the substrate 100 is loaded into a chamber having a pressure in the range of about 1.0 mTorr to about 760 Torr.

As shown in FIG. 10, a first reaction gas for nucleation is provided onto the substrate 100 in step S10, and then a portion of the first reaction gas is chemically absorbed (i.e., chemisorbed) onto the sidewall and the bottom face of the contact hole structure 116 and onto the recess 118. The first reaction gas may include $SiH_4$ and/or $B_2H_6$.

A first purge gas is introduced into the chamber in step S12. The first purge gas removes a portion of the first reaction gas physically absorbed (i.e., physisorbed) to the chemisorbed portion of the first reaction gas and the substrate 100. The first purge gas further removes a remaining portion of the first reaction gas drifting in the chamber. The first purge gas may include an inactive gas, for example, a nitrogen gas and/or an argon gas.

In step S14, a second reaction gas is provided onto the substrate 100 to form the first metal layer 120 on the sidewall and the bottom face of the contact hole structure 116 and laterally extending into the recess 118. That is, the second reaction gas reacts with the chemisorbed portion of the first reaction gas to thereby from the first metal layer 120. The second reaction gas may include $WF_6$.

An unreacted portion of the second reaction gas is purged using a second purge gas in step S16. That is, the second purge gas is introduced into the chamber to remove the unreacted portion of the second reaction gas from the chamber. The second purge gas may include an inactive gas, such as a nitrogen gas and/or an argon gas.

When one cycle including the steps S10, S12, S14 and S16 is performed, a first metal film is formed on the sidewall and the bottom face of the contact hole structure 116 and in the recess 118. The steps for forming the first metal film may be repeatedly performed to form the first metal layer 120 to a desired thickness. The first metal layer 120 laterally extends into the recess 118, on the sidewall of the contact hole structure 116, and on the exposed portion of the substrate 100.

Figure 8:
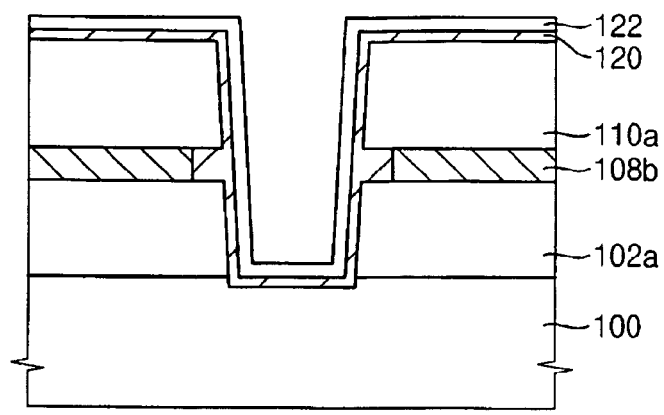

Referring to FIG. 8, a metal nitride layer 122 serving as a buffer layer is formed on the first metal layer 120. The metal nitride layer 122 may enhance adhesion strength between the first metal layer 120 and a lower metal layer 124a (see FIG. 9). When the first metal layer 120 includes tungsten, the metal nitride layer 122 may include tungsten nitride.

The metal nitride layer 122 may be formed by an ALD process to provide good step coverage. When the metal nitride layer 122 is formed through the ALD process, the metal nitride layer 122 may be formed at a relatively low temperature in the range of about 50° C. to about 450C.°. Further, the metal nitride layer 122 may have a thickness in the range of about 5 Å to about 100 Å. For example, the thickness of the metal nitride layer 122 may be about 25 Å to about 35 Å. In some embodiments of the present invention, the processes for forming the first metal layer 120 and the metal nitride layer 122 may be performed in-situ.

Hereinafter, a process for forming the metal nitride layer 122 will be described in detail.

Figure 11:
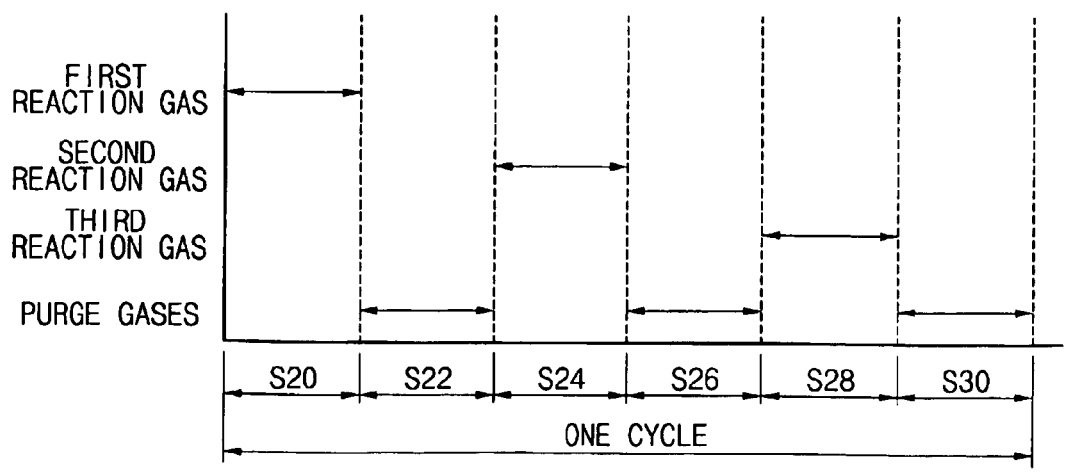
FIG. 11 is a timing diagram illustrating reaction gases used in a process for forming a metal nitride layer in accordance with some embodiments of the present invention.

FIG. 11 is a timing diagram illustrating reaction gases used in a process for forming the metal nitride layer 122 in accordance with some embodiments of the present invention. To form the metal nitride layer 122 by the ALD process, the substrate 100 is loaded into a chamber having a pressure in the range of about 1.0 mTorr to about 760 Torr.

Referring to FIG. 11, after a first reaction gas for nucleation is provided onto the substrate 100 in step S20, a portion of the first reaction gas is chemisorbed onto the first metal layer 120. The first reaction gas may include $SiH_4$ and/or $B_2H_6$.

A first purge gas is introduced into the chamber in step S22 so as to remove a portion of the first reaction gas physisorbed to the chemisorbed portion of the first reaction gas and the substrate 100. The first purge gas also removes a remaining portion of the first reaction gas drifting in the chamber. The first purge gas may include an inactive gas, such as a nitrogen gas and/or an argon gas.

A second reaction gas is introduced into the chamber so that the second reaction gas reacts with the chemisorbed portion of the first reaction gas. Thus, a metal film is formed on the first metal layer 120. The second reaction gas may include $WF_6$.

In step S26, a second purge gas is introduced into the chamber in order to remove an unreacted portion of the second reaction gas. The second purge gas may include an inactive gas, for example, a nitrogen gas and/or an argon gas.

In step S28, a third reaction gas including nitrogen is provided onto the metal film so as to nitrify the metal film. Thus, a metal nitride film is formed on the first metal layer 120.

A third purge gas is introduced into the chamber in order to remove an unreacted portion of the third reaction gas from the chamber in step S30. The third purge gas may include an inert gas, such as a nitrogen gas and/or an argon gas.

After a cycle including the steps S20, S22, S24, S26 and S28 is performed, a metal nitride film is formed on the first metal layer 120. If the steps for forming the metal nitride film are repeatedly performed, the metal nitride layer 122 may be formed to a desired thickness on the first metal layer 120.

Figure 9:
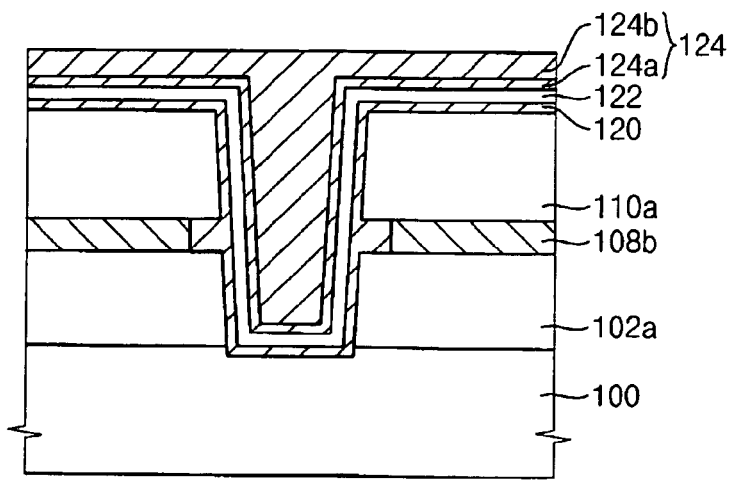

Referring to FIG. 9, a second metal layer 124 is formed on the metal nitride layer 122 to substantially fill the contact hole structure 116. The second metal layer 124 may be formed using a process chamber connected to the chamber for forming the first metal layer 120 and the metal nitride layer 122. The second metal layer 124 may be formed using tungsten.

In the formation of the second metal layer 124, the lower metal layer 124a is formed on the metal nitride layer 122 to partially fill the contact hole structure 116. Then, an upper metal layer 124b is formed on the lower metal layer 124a to substantially fill the contact hole structure 116. The lower metal layer 124a may be formed by an ALD process, whereas the upper metal layer 124b may be formed by a CVD process. The lower and the upper metal layers 124a and 124b may be formed using one process chamber. The lower metal layer 124a may have a thickness in the range of about 5 Å to about 100 Å. For example, the thickness of the lower metal layer 124a may be about 25 Å to about 35 Å.

Since the lower metal layer 124a is formed on the metal nitride layer 122 by the ALD process to provide sufficient step coverage, the upper metal layer 124b may substantially fill the contact hole structure 116 without generation of a void or a seam in the upper metal layer 124b. Additionally, the upper metal layer 124b is formed by the CVD process, so that the upper metal layer 124b may rapidly fill the contact hole structure 116.

Portions of the second metal layer 124, the metal nitride layer 122 and the first metal layer 120 are removed until a surface of the second insulating interlayer pattern 110a is exposed, thereby forming the contact plug in the contact hole structure 116, as shown in FIG. 1. The contact plug may be formed by a CMP (chemical-mechanical polishing) process and/or by an etch back process. The contact plug includes a first metal layer pattern, a metal nitride layer pattern, and a second metal layer pattern. The first metal layer pattern laterally extends into the recess 118 between the first and second insulating layer patterns 102a and 110a to contact the single crystalline silicon layer pattern 108b. The second metal layer pattern may include a lower metal layer pattern and an upper metal layer pattern.

Figure 12:
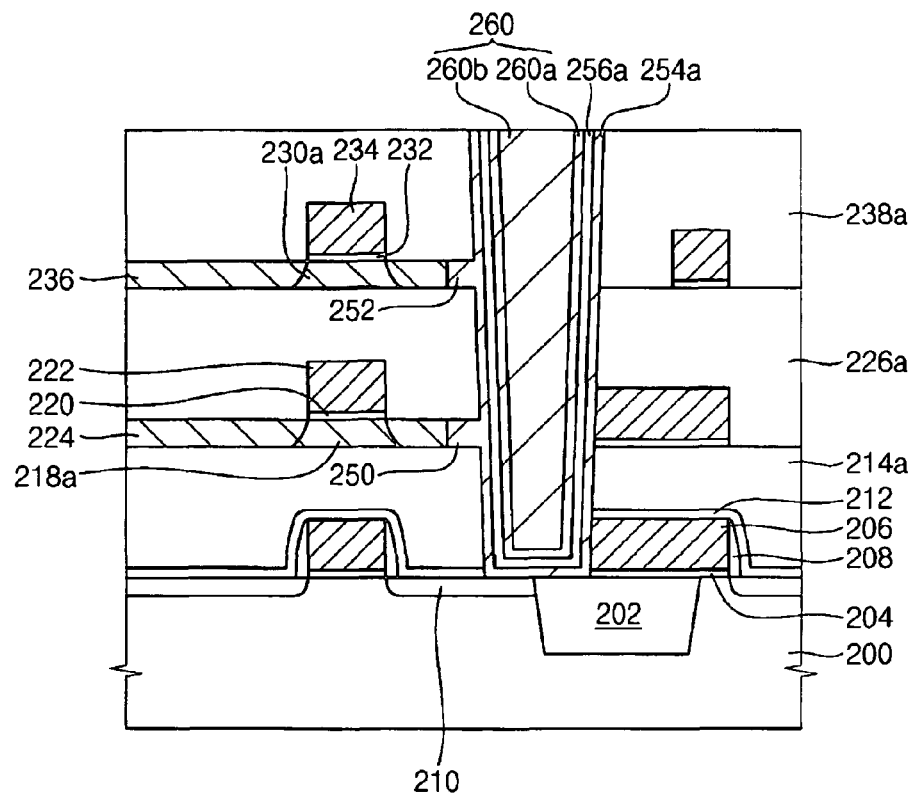
FIG. 12 is a cross-sectional view illustrating a stacked semiconductor device in accordance with further embodiments of the present invention.

FIG. 12 is a cross-sectional view illustrating a stacked semiconductor device in accordance with further embodiments of the present invention. In FIG. 12, a triple-stacked static random access memory (SRAM) device is shown. Referring now to FIG. 12, an isolation layer 202 is formed on a substrate 200 including single crystalline silicon. The isolation layer 202 divides the substrate 200 into a first active region and a field region. First N type MOS (NMOS) transistors may be formed on the first active region as pull-down devices.

Each of the first NMOS transistors includes a first gate insulation layer pattern 204, a first conductive layer pattern 206 and first source/drain regions 210. The first gate insulation layer pattern 204 may include an oxide or metal oxide, and the first conductive layer pattern 206 may include polysilicon doped with impurities.

A P type well (P-well) is formed in a portion of the substrate 200 where the first NMOS transistors are positioned. The first source/drain regions 210 are formed in the P-well. N type impurities may be doped into the first source/drain regions 210.

A gate spacer 208 is formed on a sidewall of the first conductive layer pattern 206. A nitride liner 212 is continuously formed on the gate spacer 208, the first conductive layer pattern 206 and the substrate 200.

A first insulating interlayer pattern 214a is formed on the nitride liner 212 to cover the first NMOS transistors. A first contact hole is formed extending through the first insulating interlayer 214a to expose a surface portion of the substrate 200 and the sidewall of the first conductive layer pattern 206. The first insulating interlayer pattern 214a may be planarized using a CMP process and/or an etch back process. The first insulating interlayer pattern 214a may include an oxide, such as silicon oxide. For example, the first insulating interlayer pattern 214a may include HDP-CVD oxide or BPSG.

A second insulating interlayer pattern 226a is formed on the first insulating interlayer pattern 214a. A second contact hole exposing the first contact hole is formed extending through the second insulating interlayer pattern 226a. Hence, the portion of the substrate 200 and the sidewall of the first conductive layer pattern 206 are exposed through the first and the second contact holes. The second insulating interlayer pattern 226a may be formed of an oxide, for example, silicon oxide.

A third insulating interlayer pattern 238a is formed on the second insulating interlayer pattern 226a. A third contact hole exposing the second contact hole is formed extending through the third insulating interlayer pattern 238a. Thus, a contact hole structure including the first, the second and the third contact holes is formed extending through the first, the second, and the third insulating interlayer patterns 214a, 226a and 238a.

A first single crystalline silicon layer pattern 218a is formed between the first insulating interlayer pattern 214a and the second insulating interlayer pattern 226a. A side portion of the first single crystalline silicon layer pattern 218a is exposed through a first recess 250 between the first insulating interlayer pattern 214a and the second insulating interlayer pattern 226a. The first recess 250 is "connected to" (i.e., extends from) the second contact hole. The first single crystalline silicon layer pattern 218a may serve as a second active region of the stacked semiconductor device.

P type MOS transistors (PMOS) are formed on the first single crystalline silicon layer pattern 218a as pull-up devices. Each of the PMOS transistors includes a second gate insulation layer pattern 220, a second conductive layer pattern 222 and second source/drain regions 224. N type impurities may be doped into a portion of the first single crystalline silicon layer pattern 218a corresponding to a channel region of the PMOS transistor. P type impurities may be doped into the second source/drain regions 224 of the PMOS transistor.

At least one PMOS transistor is positioned on the first single crystalline silicon layer pattern 218a separated from an adjacent portion of the first single crystalline silicon layer pattern 218a. The second source/drain regions 224 are formed from an upper portion of the first single crystalline silicon layer pattern 218a to a bottom portion of the first single crystalline silicon layer pattern 218a. The second contact hole exposes a side portion of the second conductive layer pattern 222.

A second single crystalline silicon layer pattern 230a is formed between the second insulating interlayer pattern 226a and the third insulating interlayer pattern 238a. A second recess 252 between the second insulating interlayer pattern 226a and the third insulating interlayer pattern 238a is connected to the third contact hole, and exposes a side portion of the second single crystalline silicon layer pattern 230a. As such, both of the first recess 250 and the second recess 252 extend from the contact hole structure. The second single crystalline silicon layer pattern 230a serves as a third active region of the stacked semiconductor device.

Second NMOS transistors are formed on the second single crystalline silicon layer pattern 230a as access devices. For example, two of the second NMOS transistors may be formed on the second single crystalline silicon layer pattern 230a. Each of the second NMOS transistors includes a third gate insulation layer pattern 232, a third conductive layer pattern 234 and third source/drain regions 236. P type impurities may be doped into a portion of the second single crystalline silicon layer pattern 230a corresponding to a channel region of the second NMOS transistor. N type impurities may be doped into the third source/drain regions 236 of the second NMOS transistor.

At least one second NMOS transistor is formed on the second single crystalline silicon layer pattern 230a. The third source/drain regions 236 are formed from an upper portion of the second single crystalline silicon layer pattern 230a to a bottom portion of the single crystalline silicon layer pattern 230a.

A first epitaxial layer pattern (not shown) may be formed between the substrate 200 and the first single crystalline silicon layer pattern 218a. The first epitaxial layer pattern may be formed by a selective epitaxial growth (SEG) process. The first epitaxial layer pattern may have a plug structure. Additionally, a second epitaxial layer pattern (not shown) may be formed between the first single crystalline silicon layer pattern 218a and the second single crystalline silicon layer pattern 230a. The second epitaxial layer pattern may also have a plug structure, and may be similarly formed through an SEG process. The contact hole structure may partially expose the first and the second epitaxial layer patterns. The contact hole structure also exposes a portion of the substrate 200.

A first metal layer pattern 254a is formed on a sidewall of the contact hole structure and a bottom/lower surface of the contact hole structure (i.e., the exposed portion of the substrate). The first metal layer pattern 254a laterally extends to fill the first recess 250 and the second recess 252. The first metal layer pattern 254a may be horizontally grown in the first and the second recesses 250 and 252. Thus, the first metal layer pattern 254a contacts the first single crystalline silicon layer pattern 218a and the second single crystalline silicon layer pattern 230a. The first metal layer pattern 254a may be formed using a metal that has a relatively low specific resistance. Further, the first metal layer pattern 254a may be formed by an ALD process to provide good step coverage.

The first metal layer pattern 254a directly contacts the first and the second single crystalline layer patterns 218a and 230a, the exposed portion of the substrate 200, the first conductive layer pattern 206, and the second conductive layer pattern 222. Therefore, the first metal layer pattern 254a may serve as an ohmic layer in the stacked semiconductor device. More particularly, the first metal layer pattern 254a contacts the exposed portion of the substrate 200 including the first source/drain regions 210 of the first NMOS transistor serving as a pull-down device. The first metal layer pattern 254a also contacts the second source/drain regions 224 of the PMOS transistor exposed through the first recess 250. The first metal layer pattern 254a further contacts the third source/drain regions 236 of the second NMOS transistor exposed through the second recess 252. Accordingly, the first metal layer pattern 254a electrically connects the first, second, and third source drain regions 210, 224, and 236.

If the first metal layer pattern 254a has a thickness of below about 5 Å, the first metal layer pattern 254a may not provide an ohmic layer. In addition, a process time for forming the first metal layer pattern 254a may greatly increase when the first metal layer pattern 254a has a thickness of above about 100 Å. Thus, the first metal layer pattern 254a may have a thickness in the range of about 5 Å to about 100 Å. For example, the first metal layer pattern 254a may have a thickness in the range of about 25 Å to about 35 Å. Portions of the first metal layer pattern 254a laterally extending into the first and the second recesses 250 and 252 may have a greater thickness than that of other portions of the first metal layer pattern 254a, because the laterally extending portions of the first metal layer pattern 254a may completely fill the first and the second recesses 250 and 252.

A metal nitride layer pattern 256a is formed on the first metal layer pattern 254a. The metal nitride layer pattern 256a may serve as a buffer layer. The metal nitride layer pattern 256a may be formed of, for example, tungsten nitride. In addition, the metal nitride layer pattern 256a may be formed by an ALD process, so as to provide good step coverage.

If the metal nitride layer pattern 256a has a thickness of below about 5 Å, the metal nitride layer pattern 256a may not provide sufficient adhesion strength between the first metal layer pattern 254a and a second metal layer pattern 260. Likewise, if the metal nitride layer pattern 256a has a thickness of above about 100 Å, a sheet resistance of a contact plug in the stacked semiconductor device may greatly increase. Thus, the metal nitride layer pattern 256a may have a thickness in the range of about 5 Å to about 100 Å. For example, the thickness of the metal nitride layer pattern 256a may be about 25 Å to about 35 Å.

The second metal layer pattern 260 is formed on the metal nitride layer pattern 256a to substantially fill the contact hole structure. The second metal layer pattern 260 includes a lower metal layer pattern 260a and an upper metal layer pattern 260b. The lower metal layer pattern 260a may be formed by an ALD process, while the upper metal layer pattern 260b may be formed by a CVD process. The lower metal layer pattern 260a is formed on the metal nitride layer pattern 256a to partially fill the contact hole structure, and the upper metal layer pattern 260b is formed on the lower metal layer pattern 260a to substantially fill the contact hole structure. The second metal layer pattern 260 may be formed of a metal that has good step coverage. For example, the second metal layer pattern 260 may be formed of tungsten.

As shown in FIG. 12, the first recess 250 is formed between the first single crystalline silicon layer pattern 218a and the contact hole structure, and the second recess 252 is formed between the contact hole structure and the second single crystalline silicon layer pattern 230a. The first metal layer pattern 254a laterally extends to fill the first and the second recesses 250 and 252 along a horizontal direction relative to the substrate 200. Therefore, the stacked semiconductor device may include a contact plug having lower sheet resistances among the first single crystalline silicon layer pattern 218a, the second single crystalline silicon layer pattern 230a and the first metal layer pattern 254a.

Figure 13:
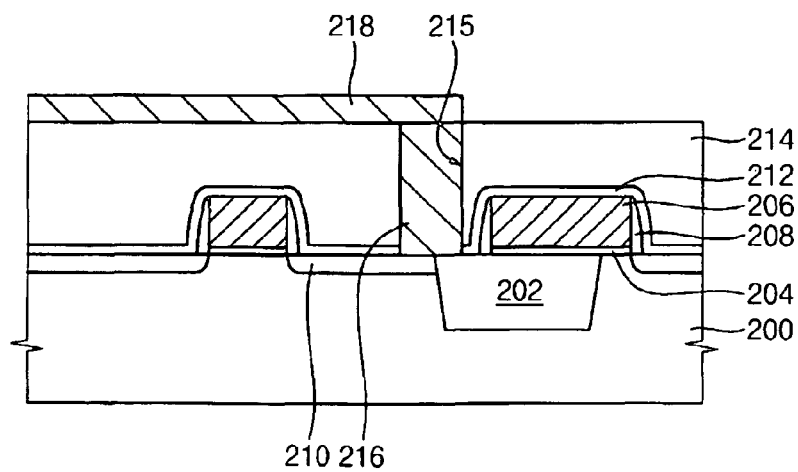
FIGS. 13 to 18 are cross-sectional views illustrating methods of fabricating stacked semiconductor devices in accordance with further embodiments of the present invention.

FIGS. 13 to 18 are cross-sectional views illustrating methods of fabricating stacked semiconductor devices in accordance with further embodiments of the present invention. Referring now to FIG. 13, an isolation layer 202 is formed on a substrate 200 including single crystalline silicon through an isolation process, such as a shallow trench isolation (STI) process. When the isolation layer 202 is formed on the substrate 200, a first active region of the substrate 200 is defined.

After a first gate insulation layer (not shown) is formed on the substrate 200, a first conductive layer (not shown) is formed on the first gate insulation layer. The first gate insulation layer may be formed of an oxide or metal oxide. The first conductive layer may be formed using polysilicon doped with impurities. The first conductive layer and the first gate insulation layer are sequentially etched to thereby form a first gate structure on the substrate 200. The first gate structure includes a first gate insulation layer pattern 204 and a first conductive layer pattern 206. In an some embodiments of the present invention, the first conductive layer pattern 206 may extend from the first active region onto the isolation layer 202 to provide a connection structure for a stacked semiconductor device, for example, an SRAM device.

A gate spacer 208 is formed on the first gate structure. The gate spacer 208 may be formed of a nitride, such as silicon nitride. A nitride liner 212 is formed on the substrate 200 to cover the gate spacer 208 and an upper surface of the first gate structure. The nitride liner 212 may serve as an etch stop layer in subsequent etching processes.

First source/drain regions 210 are formed at portions of the first active region adjacent to the first gate structure. The first source/drain regions 210 may be formed by doping N type impurities into the portions of the first active region. As a result, a first NMOS transistor serving as a pull-down device is formed on the substrate 200.

A first insulating interlayer 214 is formed on the substrate 200 to cover the first NMOS transistor. The first insulating interlayer 214 may be formed of an oxide, for example, silicon oxide. The first insulating interlayer 214 may be planarized by a CMP process and/or an etch back process.

A first opening 215 is formed through the first insulating interlayer 214 by partially etching the first insulating interlayer 214. The first opening 215 exposes a surface of the substrate 200 including the first source/drain regions 210.

After a first epitaxial layer pattern 216 is formed on the exposed portion of the substrate 200 to fill the first opening 215, a preliminary first single crystalline silicon layer pattern 218 is formed on the first epitaxial layer pattern 216 and the first insulating interlayer pattern 214. The first epitaxial layer pattern 216 and the first preliminary single crystalline silicon layer pattern 218 may be formed via processes substantially similar to those described with reference to FIGS. 4 and 5.

Figure 14:
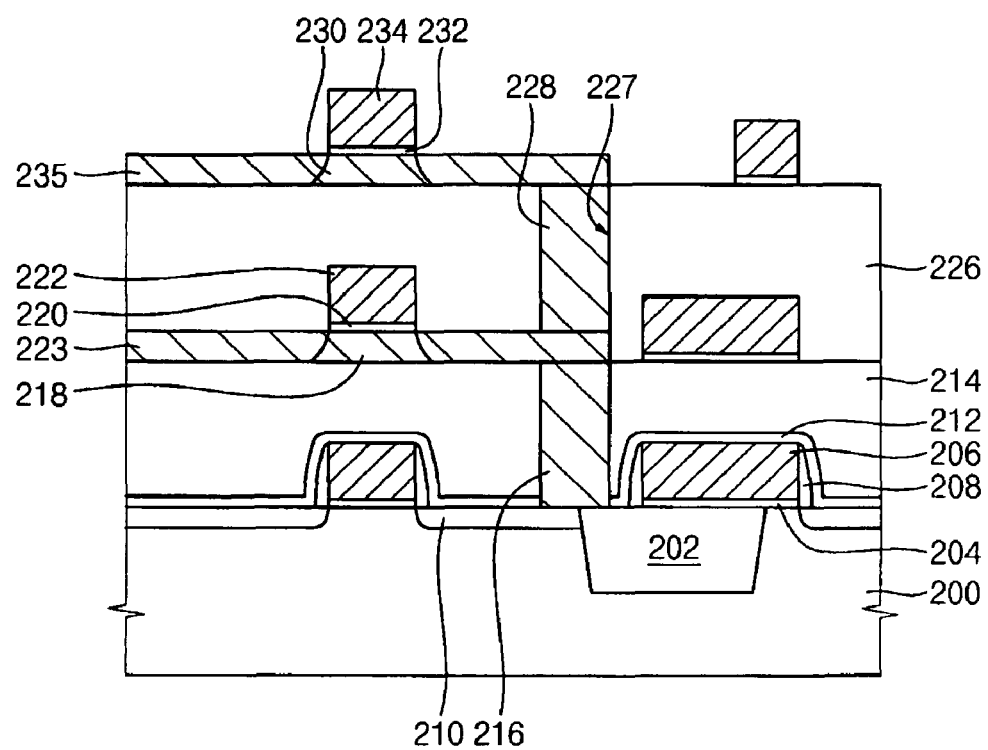

Referring to FIG. 14, a second gate insulation layer (not shown) is formed on the preliminary first single crystalline silicon layer pattern 218 and the first insulating interlayer 214.

After a second conductive layer is formed on the second gate insulation layer, the second conductive layer and the second gate insulation layer are successively etched to form a second gate structure on the preliminary first single crystalline silicon layer pattern 218. The second gate structure includes a second gate insulation layer pattern 220 and a second conductive layer pattern 222.

Preliminary second source/drain regions 223 are formed at portions of the preliminary first single crystalline silicon layer pattern 218 adjacent to the second gate structure by implanting P type impurities into the portions of the preliminary first single crystalline silicon layer pattern 218. The preliminary second source/drain regions 223 extend to peripheral portions of the preliminary first single crystalline silicon layer pattern 218. The second conductive layer pattern 222 may extend onto the first insulating interlayer 214 so as to provide a connection structure for a stacked semiconductor device, such as an SRAM device. When the preliminary second source/drain regions 223 are formed, a PMOS transistor serving as a pull-up device is defined on the preliminary first single crystalline silicon layer pattern 218.

A second insulating interlayer 226 is formed on the first insulating interlayer 214 and the preliminary first single crystalline silicon layer 218. Then, the second insulating interlayer 226 is partially etched to form a second opening 227 that exposes a portion of the preliminary first single crystalline silicon layer 218.

After a second epitaxial layer pattern 228 is formed in the second opening 227, a preliminary second single crystalline silicon layer 230 is formed on the second epitaxial layer pattern 228 and the second insulating interlayer 226. The second epitaxial layer pattern 228 and the preliminary second single crystalline silicon layer 230 may be formed through processes substantially similar to those described with reference to FIGS. 4 and 5.

Figure 15:
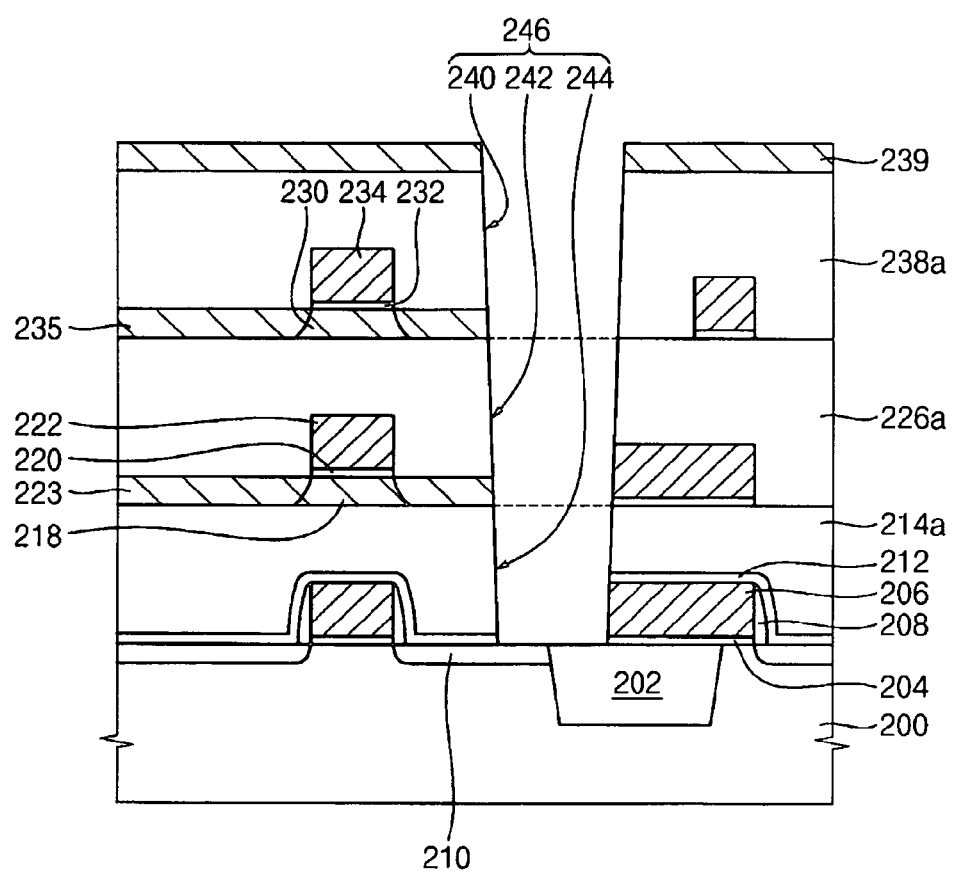

Referring to FIG. 15, a third gate insulation layer (not shown) is formed on the preliminary second single crystalline silicon layer 230, and then a third conductive layer (not shown) is formed on the third gate insulation layer.

The third conductive layer and the third gate insulation layer are partially etched so that a third gate structure is formed on the preliminary second single crystalline silicon layer 230. The third gate structure includes a third gate insulation layer pattern 232 and a third conductive layer pattern 234.

N type impurities are doped into portions of the preliminary second single crystalline silicon layer 230 adjacent to the third gate structure so that third preliminary source/drain regions 235 are formed at the portions of the preliminary second single crystalline silicon layer 230. Thus, a second NMOS transistor is formed on the preliminary second single crystalline silicon layer 230. The third conductive layer pattern 234 may also extend onto the second insulating interlayer 226, to provide a connection structure for a stacked semiconductor device. A third insulating interlayer 238 is formed on the preliminary second single crystalline silicon layer 230 and the second insulating interlayer 238 to cover the second NMOS transistor.

Figure 16:
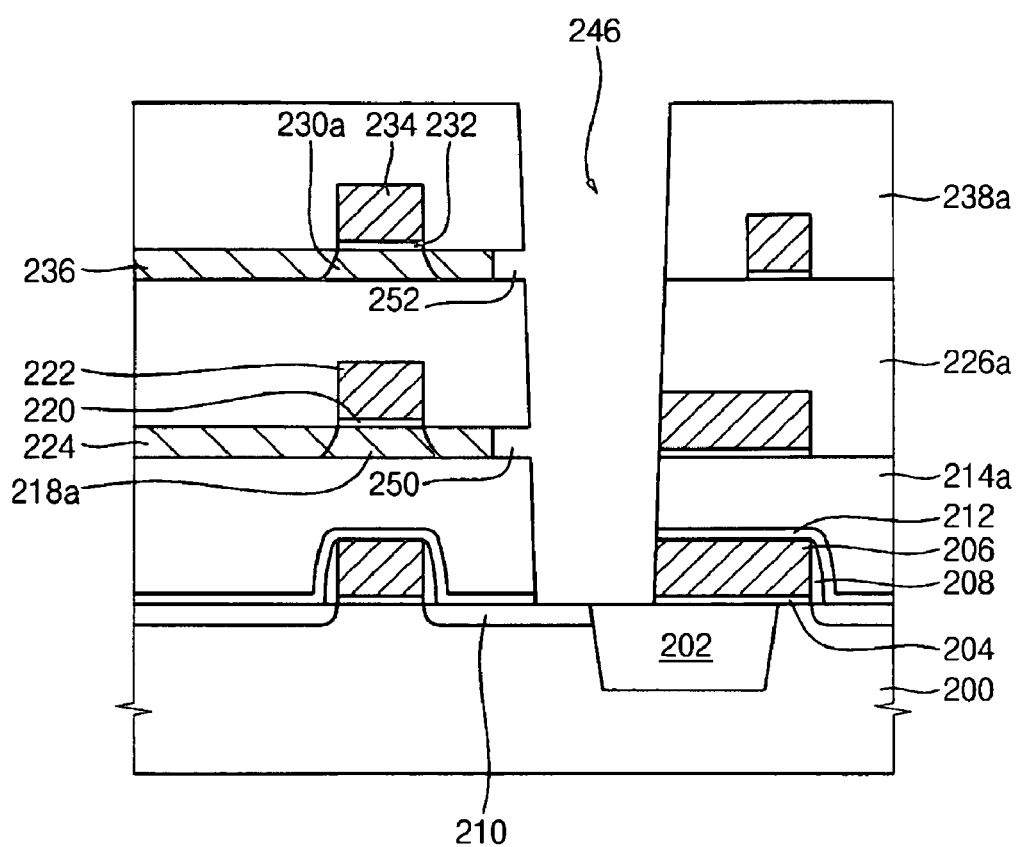

Referring to FIG. 16, a hard mask layer (not shown) and an anti-reflective layer (not shown) are sequentially formed on the third insulating interlayer 238. The hard mask layer may be formed of a nitride, for example, silicon nitride, by a CVD process. The anti-reflective layer may be formed of an oxynitride, such as silicon oxynitride, by a CVD process. The anti-reflective layer and the hard mask layer are partially etched to form an anti-reflective layer pattern (not shown) and a hard mask pattern 239 on the third insulating interlayer 238a. The hard mask pattern 239 exposes a portion of the third insulating interlayer 238a at least partially overlapped with the first and the second epitaxial layer patterns 216 and 228.

The third insulating interlayer 238 is partially etched using the hard mask pattern 239 as an etching mask, to thereby form a third insulating interlayer pattern 238a including a third contact hole 240 extending therethrough that exposes a portion of the preliminary second single crystalline silicon layer 230. The third gate structure is not exposed by the third contact hole 240.

The second epitaxial layer pattern 228 and a portion of the second insulating interlayer 226 are etched using the hard mask pattern 239 as an etching mask, thereby forming a second insulating interlayer pattern 226a having a second contact hole 242 extending therethrough. A portion of the preliminary first single crystalline silicon layer 218 is exposed by the second contact hole 242. Additionally, the second contact hole 242 exposes a portion of the second conductive layer pattern 222 extending on the first insulating interlayer 214. However, the portion of the second conductive layer pattern 222 on the preliminary first single crystalline silicon layer 218 (i.e., the second gate structure) is not exposed through the second contact hole 242.

The first epitaxial layer pattern 216 and a portion of the first insulating interlayer 214 are etched using the hard mask 239 as an etching mask so that a first insulating interlayer pattern 214a having a first contact hole 244 extending therethrough is formed on the substrate 200. The first contact hole 244 exposes a surface of the substrate 200 including the first source/drain regions 210.

In the etching processes for forming the first, the second, and the third contact holes 240, 242 and 244, the anti-reflective layer pattern and the hard mask pattern 239 may be consumed.

Although the first and the second epitaxial layer patterns 216 and 228 are removed in the etching processes for forming the first to the third contact holes 240, 242 and 244 in FIG. 16, portions of the first and the second epitaxial layer patterns 216 and 228 may remain on the first and the second insulating interlayer patterns 214a and 238a when a cross-section of the stacked semiconductor device is taken along a direction substantially different from that of the cross-section shown in FIG. 16. In some embodiments of the present invention, the remaining first and second epitaxial layer patterns 216 and 228 may be exposed through the first to the third contact holes 240, 242 and 244.

Accordingly, the first, the second and the third contact holes 240, 242 and 244 are connected to one another. Thus, a contact structure/opening including the first to the third contact holes 240, 242 and 244 is formed extending through the first to the third insulating interlayer patterns 214a, 226a and 238a.

The preliminary first single crystalline silicon layer pattern 218 and the preliminary second single crystalline silicon layer pattern 230 are selectively recessed (for example, via a wet etching process) to respectively form a first recess 250 and a second recess 252. Thus, a first single crystalline silicon layer pattern 218a is formed between the first insulating interlayer pattern 214a and the second insulating interlayer pattern 226a. Additionally, a second single crystalline silicon layer pattern 230a is formed between the second insulating interlayer pattern 226a and the third insulating interlayer pattern 238a. The first recess 250 exposes a side portion of the first single crystalline silicon layer pattern 218a, and the second recess 252 exposes a side portion of the second single crystalline silicon layer pattern 230a. The first and the second recesses 250 and 252 are connected to the contact hole structure. The first and the second recesses 250 and 252 laterally extend from the sidewall of the contact hole structure along a horizontal direction relative to the substrate 200. The first and the second single crystalline silicon layer patterns 218a and 230a have lengths that are shorter than those of the preliminary first and the preliminary second single crystalline silicon layer patterns 218 and 230 by widths of the first and the second recesses 250 and 252, respectively.

In the etching the first and the second recesses 250 and 252, portions of the preliminary first and the preliminary second single crystalline silicon layer patterns 218 and 230 are selectively recessed without substantially etching the first to the third insulating interlayer patterns 214a, 226a and 238a. Thus, the first and the second recesses 250 and 252 may be formed by a wet etching process using an etching solution that has an etching selectivity of above about 1:10 between the preliminary single crystalline silicon layer patterns 218 and 230 and the insulating interlayer structure. The etching solution may include $NH_4OH$, $H_2O_2$ and $H_2O$, at a ratio of about 4:1:95.

When the first recess 250 is formed between the first insulating interlayer pattern 214a and the second insulating interlayer pattern 226a, the preliminary second source/drain regions 223 are changed to second source/drain regions 224 that have areas smaller than those of the preliminary second source/drain regions 223. The size of the first recess 250 may be controlled to avoid excessive consumption of the second source/drain regions 224. Likewise, the preliminary third source/drain regions 235 form third source/drain regions 236 that have areas smaller than those of the preliminary third source/drain regions 235. The size of the second recess 252 may be adjusted to prevent an excessive consumption of the third source/drain regions 236.

Figure 17:
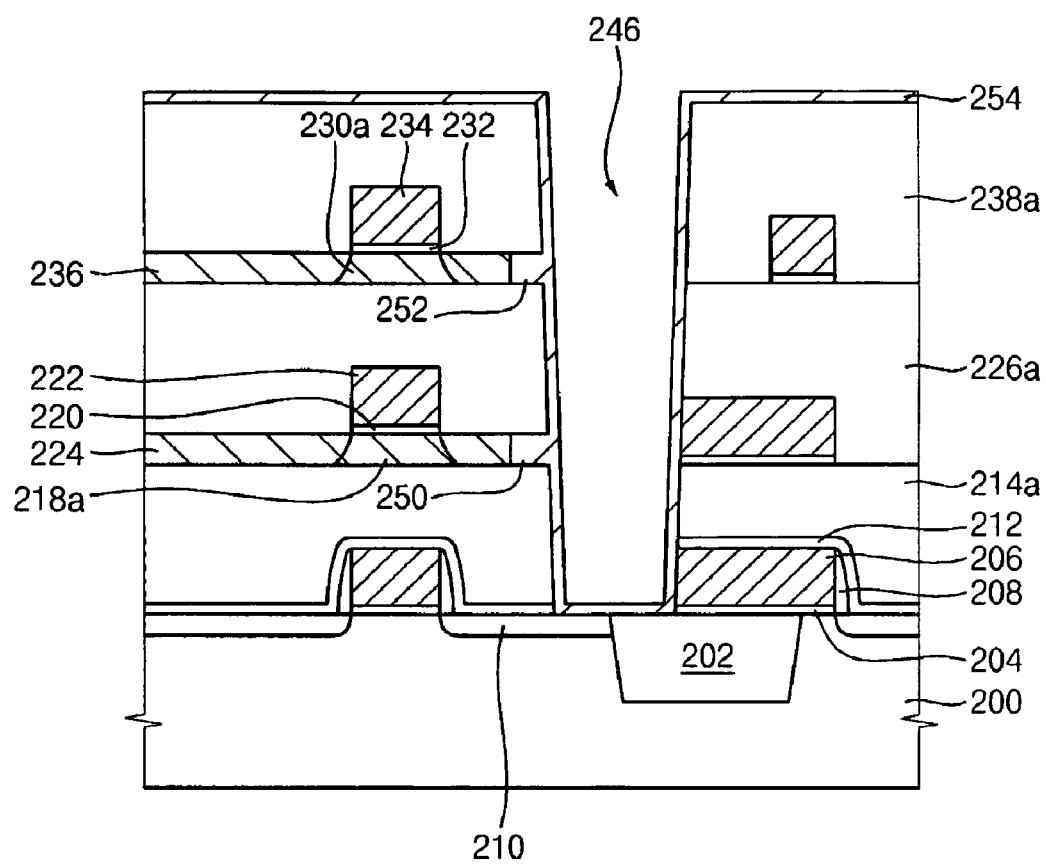

Referring to FIG. 17, a continuously first metal layer 254 is formed laterally extending into the first and the second recesses 250 and 252, on the sidewall of the contact hole structure, on the exposed surface of the substrate 200, and on the upper surface of the third insulating interlayer pattern 238a. The first metal layer 254 laterally extends to fill the first and the second recesses 250 and 252. The first metal layer 254 is also formed on the exposed portions of the first and the second conductive layer patterns 206 and 222 at the sidewall of the contact opening. Since the first metal layer 254 laterally extends into the first and the second recesses 250 and 252, the first metal layer 254 may fill the first and the second recesses 250 and 252 without generation of voids and/or seams in the first and the second recesses 250 and 252. The first metal layer 254 may be formed using tungsten.

Since the first metal layer 254 is formed laterally extending into the first and the second recesses 250 and 252, and on the bottom surface and the sidewall of a contact structure having a relatively high aspect ratio, the first metal layer 254 may be formed by an ALD process so as to provide good step coverage. When the first metal layer 254 is formed by the ALD process, the first metal layer 254 may be formed at a relatively low temperature in the range of about 50° C. to about 450° C. Thus, consumption of the first and/or the second single crystalline silicon layer patterns 218a and 230a may be reduced and/or avoided, by preventing a reaction between the metal of the first metal layer 254 and the silicon of the first and the second single crystalline silicon layer patterns 218a and 230a.

The first metal layer 254 may have a thickness in the range of about 5 Å to about 100 Å. For example, the first metal layer 254 may have a thickness in the range of about 30 Å. Since the first metal layer 254 is horizontally formed in the first and the second recesses 250 and 252, portions of the first metal layer 254 in the first and the second recesses 250 and 252 may have thickness that are substantially thicker than other portions of the first metal layer 254. Accordingly, as the portions of the first metal layer 254 that contact the single crystalline silicon layer patterns 218a and 230a have a relatively greater thickness, contact resistances between the first metal layer 254 and the second source/drain regions 224 and between the first metal layer 254 and the third source/drain regions 236 may be reduced. Therefore, transistors may have improved operation characteristics, as operating currents for the transistors may be increased due to the decreases in a contact resistance.

Figure 18:
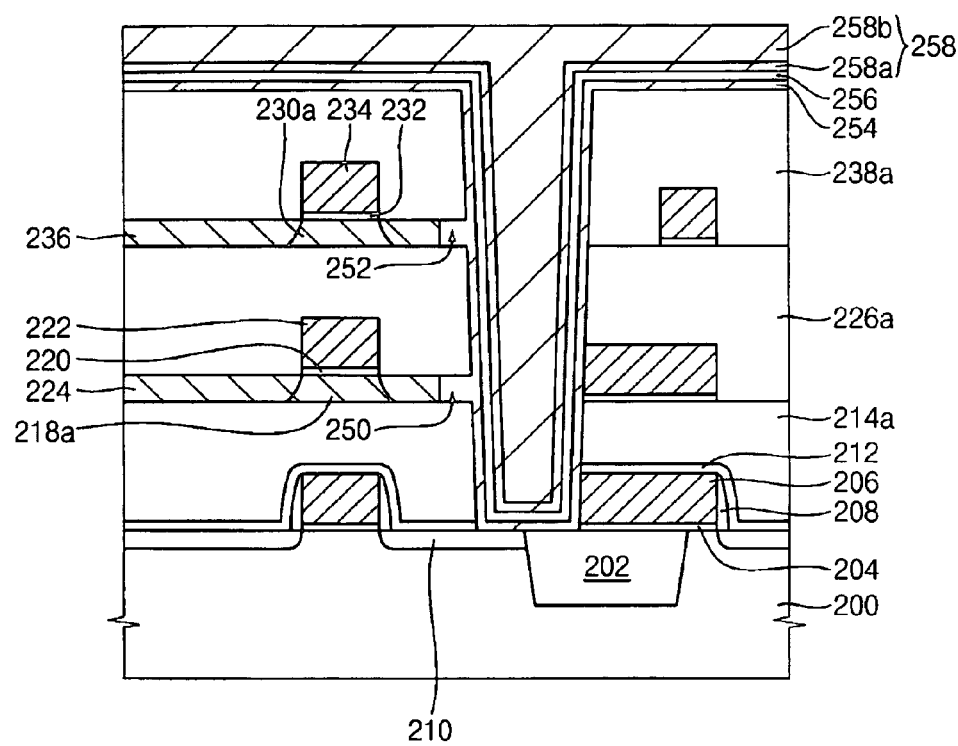

Referring to FIG. 18, a metal nitride layer 256 is formed on the first metal layer 254. The metal nitride layer 256 may serve as a buffer layer. For example, when the first metal layer 254 includes tungsten, the metal nitride layer 256 may include tungsten nitride. The metal nitride layer 256 may be formed by an ALD process to provide good step coverage. When the metal nitride layer 256 is formed using the ALD process, the metal nitride layer 256 may be formed at a relatively low temperature in the range of about 50° C. to about 450° C. The metal nitride layer 256 may have a thickness in the range of about 5 Å to about 100 Å. For example, the thickness of the metal nitride layer 256 may be about 30 Å. In some embodiments of the present invention, the first metal layer 254 and the metal nitride layer 256 may be formed in-situ, using one reaction chamber.

A second metal layer 258 is formed on the metal nitride layer 256 to substantially fill the contact hole structure. The second metal layer 258 includes a lower metal layer 258a and an upper metal layer 258b. The second metal layer 258 may be formed by processes substantially similar to those described with reference to FIG. 9.

Portions of the second metal layer 258, the metal nitride layer 256 and the first metal layer 254 are removed until the upper surface of third insulating interlayer pattern 238a is exposed. Therefore, a contact plug is formed in the contact hole structure, as shown in FIG. 12. The contact plug includes a first metal layer pattern 254a, a metal nitride layer pattern 256a and a second metal layer pattern 260. The first metal layer pattern 254a laterally extends into the first recess 250 between the first and second insulating layer patterns 214a and 226a to contact the second source/drain region 224, and laterally extends into the second recess 252 between the second and third insulating layer patterns 226a and 238a to contact the third source/drain region 236. The second metal layer pattern 260 includes a lower metal layer pattern 260a and an upper metal layer pattern 260b.

As described above, the contact plug includes the first metal layer pattern 254a as an ohmic layer, thereby reducing contact resistance between the contact plug and the first single crystalline silicon layer pattern 218a, between the contact plug and the second single crystalline silicon layer pattern 230a, and between the contact plug and the surface of the substrate 200. Additionally, the first metal layer pattern 254a formed by the ALD process may horizontally fill up the first recess 250 and the second recess 252 so that the contact plug may directly contact the first and the second single crystalline silicon layer pattern 218a and 230a.

Hereinafter, ohmic characteristics of contact plugs will be described with reference to the following examples according to some embodiments of the present invention.

Figure 19:
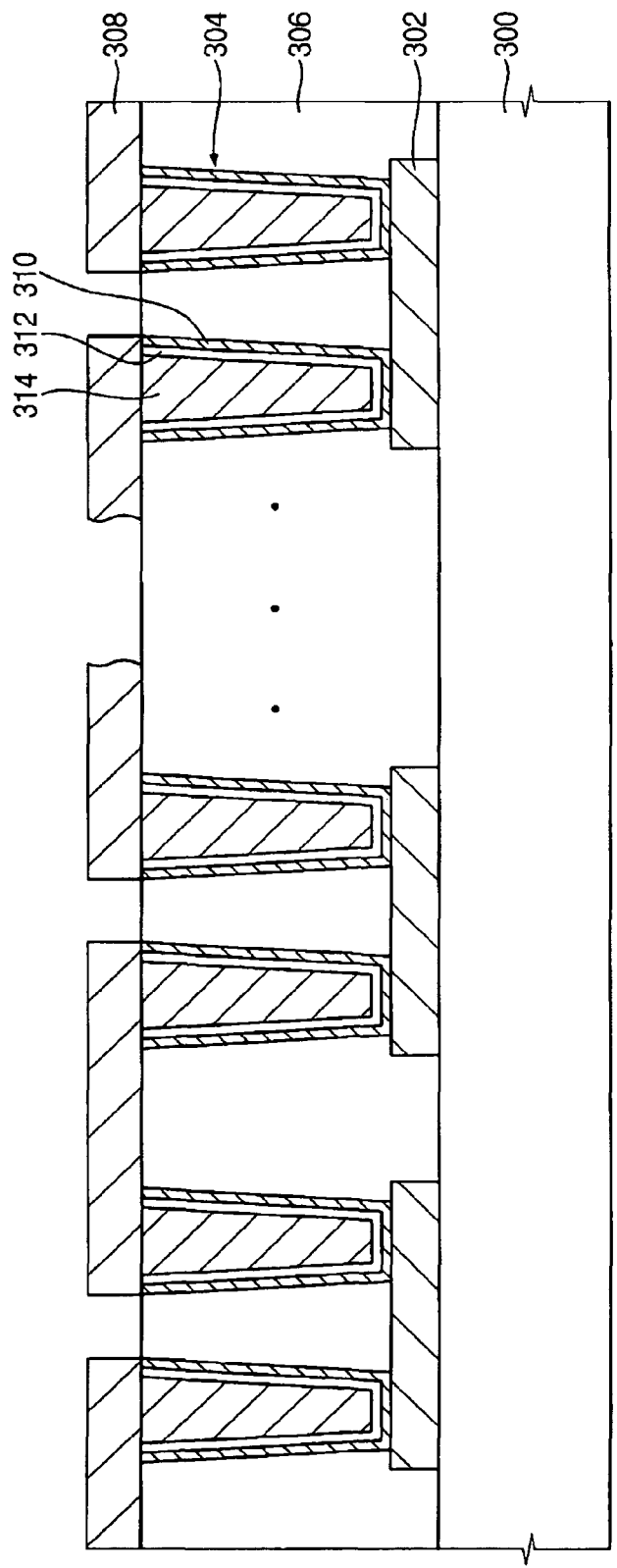
FIG. 19 is a cross-sectional view illustrating contact plugs in accordance with some embodiments of the present invention.

FIG. 19 is a cross-sectional view illustrating contact plugs in accordance with some embodiments of the present invention. As shown in FIG. 19, a sample may include about 1,000 contact plugs 304 respectively contacting lower wirings 302 formed on a substrate 300. The contact plugs 304 also respectively contact upper wirings 308. Here, two contact plugs 304 are connected to one lower wiring 302, whereas one or two contact plugs 304 are connected to one upper wiring 302. The contact plugs 304 are buried in an insulating interlayer 306 formed on the substrate 300. Each of the contact plugs 304 includes a first tungsten layer pattern 310, a tungsten nitride layer pattern 312, and a second tungsten layer pattern 314. The first tungsten layer pattern 310 is formed by an ALD process. The first tungsten layer pattern 310 may serve as an ohmic layer, and the tungsten nitride layer pattern 312 may serve as a buffer layer.

Figure 20:
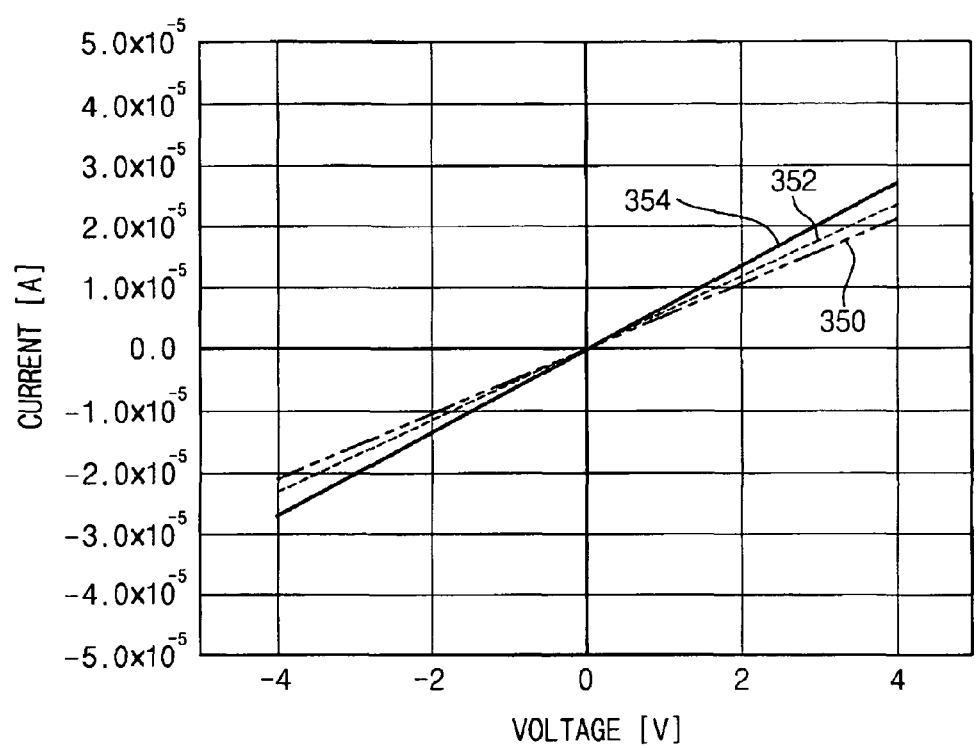
FIG. 20 is a graph illustrating ohmic characteristics of contact plugs in accordance with some embodiments of the present invention.

FIG. 20 is a graph illustrating ohmic characteristics of the contact plugs illustrated in FIG. 19. In FIG. 20, reference numerals 350, 352 and 354 respectively indicate first contact plugs having widths of about 0.15 μm, second contact plugs having widths of about 0.16 μm, and third contact plugs having widths of about 0.18 μm. The ohmic characteristics of the contact plugs in FIG. 20 were obtained by measuring voltages and currents while sweeping voltages applied to the respective upper wirings and lower wirings. As shown in FIG. 20, in the contact plugs 350, 352 and 354, the measured currents linearly increase relative to the measured voltages. Thus, the first to the third contact plugs 350, 352 and 354 have ohmic characteristics.

According to some embodiments of the present invention, a stacked semiconductor device may include a laterally extending contact plug that has a relatively low resistance and ohmic characteristics at an interface between the contact plug and a substrate and/or between the contact plug and a single crystalline silicon layer pattern. Thus, the stacked semiconductor device may have improved reliability. Additionally, a process for manufacturing stacked semiconductor devices may be enhanced.

While the present invention has been particularly shown and described with reference to example embodiments thereof, it will be understood by those of ordinary skill in the art that various changes in form and details may be made therein without departing from the spirit and scope of the present invention as defined by the following claims and their equivalents.

What is claimed is:

1. A method of forming an integrated circuit device, the method comprising:
   forming a first insulating layer on a substrate;
   forming a semiconductor layer comprising single crystalline silicon on the first insulating layer;
   forming a second insulating layer on the semiconductor layer;
   forming an opening extending through the first and second insulating layers and through the semiconductor layer between the first insulating layer and the second insulating layer to a surface of the substrate, the opening including a recess between the first and second insulating layers adjacent the semiconductor layer; and
   forming a conductive plug comprising a plurality of stacked metal layers in the opening to contact the substrate and a side of the semiconductor layer;
   wherein forming the opening further comprises selectively recessing a portion of the semiconductor layer at a sidewall of the opening to form the recess between the first and second insulating layers and to define a recessed portion of the semiconductor layer, and wherein forming the conductive plug comprises:
   forming a first conductive layer on the sidewall of the opening and on the surface of the substrate and laterally extending into the recess between the first and second insulating layers to contact the recessed portion of the semiconductor layer, wherein the first conductive layer has a greater thickness in the recess between the first and second insulating layers than a thickness on the sidewall of the opening;
   forming a buffer layer on the first conductive layer on the sidewall of the opening and on the surface of the substrate; and
   forming a second conductive layer on the buffer layer so as to substantially fill the opening with the second conductive layer,
   wherein the first and the second conductive layers respectively comprise first and second metal layers and the buffer layer comprises a metal nitride layer, wherein the first metal layer fills the recess, and wherein the first metal layer comprises an ohmic layer between the semiconductor layer and the substrate.

2. The method of claim 1, wherein selectively recessing the semiconductor layer comprises:
   etching the semiconductor layer at the sidewall of the opening without substantially etching the first and second insulating layers at the sidewall.

3. The method of claim 1, wherein portions of the first conductive layer on the sidewall of the opening have a thickness in a range of about 5 Angstroms (Å) to about 100 Angstroms (Å).

4. The method of claim 1, wherein forming the second conductive layer comprises:
   forming a lower metal layer on the metal nitride layer on the sidewall of the opening and on the surface of the substrate using an atomic layer deposition (ALD) process; and
   forming an upper metal layer on the lower metal layer using a chemical vapor deposition (CVD) process to substantially fill the opening.

5. The method of claim 1, further comprising the following prior to forming the opening:
   forming a first transistor on the substrate including a first source/drain region in the substrate; and
   forming a second transistor on the semiconductor layer including a second source/drain region in the semiconductor layer,
   wherein forming the conductive plug comprises forming the first conductive layer on the sidewall and the surface of the substrate and laterally extending into the recess between the first and second insulating layers to electrically contact the first source/drain region and the second source/drain region.

6. The method of claim 5, wherein the semiconductor layer comprises a first semiconductor layer, and further comprising the following prior to forming the opening:
   forming a second semiconductor layer on the second insulating layer;
   forming a third transistor on the second semiconductor layer including a third source/drain region in the second semiconductor layer; and
   forming a third insulating layer on the second semiconductor layer,
   wherein forming the opening further comprises selectively recessing the first and second semiconductor layers at the sidewall of the opening to respectively form first and second recesses therein, and wherein forming the first conductive layer further comprises forming the first conductive layer laterally extending into the first recess between the first and second insulating layers to electrically contact the second source/drain region and laterally extending into the second recess between the second and third insulating layers to electrically contact the third source/drain region.

7. The method of claim 1, wherein forming the conductive plug comprises:
forming the first conductive layer on the sidewall of the opening and on the surface of the substrate and laterally extending into the recess between the first and second insulating layers using an atomic layer deposition (ALD) process.

8. The method of claim 7, wherein forming the first conductive layer further comprises:
forming the first conductive layer at a temperature of about 50 degrees Celsius to about 450 degrees Celsius.

9. The method of claim 7, wherein forming the first conductive layer comprises:
introducing a first reaction gas into a chamber including the substrate;
chemically absorbing a portion of the first reaction gas onto the sidewall, the recess, and the surface of the substrate; and then
introducing a second reaction gas into the chamber to form the first conductive layer, wherein the first conductive layer comprises a metal.

10. The method of claim 9, wherein the first reaction gas comprises $SiH_4$ or $B_2H_6$, and wherein the second reaction gas comprises $WF_6$.

11. The method of claim 1, wherein the first conductive layer comprises tungsten and the buffer layer comprises tungsten nitride.

12. The method of claim 11, wherein the second conductive layer comprises tungsten.

* * * * *